United States Patent
Gosho et al.

(10) Patent No.: US 12,057,327 B2
(45) Date of Patent: Aug. 6, 2024

(54) SUBSTRATE PROCESSING APPARATUS AND SUBSTRATE PROCESSING METHOD

(71) Applicant: TOKYO ELECTRON LIMITED, Tokyo (JP)

(72) Inventors: Masataka Gosho, Koshi (JP); Yuichi Douki, Koshi (JP); Satoshi Biwa, Koshi (JP); Satoshi Okamura, Koshi (JP); Katsuhiro Ookawa, Koshi (JP); Yuichiro Kunugimoto, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 18/107,935

(22) Filed: Feb. 9, 2023

(65) Prior Publication Data

US 2023/0187233 A1  Jun. 15, 2023

Related U.S. Application Data

(63) Continuation of application No. 16/238,236, filed on Jan. 2, 2019, now abandoned.

(30) Foreign Application Priority Data

Jan. 4, 2018 (JP) .................. 2018-000247
Oct. 26, 2018 (JP) .................. 2018-201615

(51) Int. Cl.
*H01L 21/67* (2006.01)
*B08B 3/08* (2006.01)
(Continued)

(52) U.S. Cl.
CPC .......... *H01L 21/67051* (2013.01); *B08B 3/08* (2013.01); *B08B 7/04* (2013.01); *H01L 21/02057* (2013.01); *H01L 21/02101* (2013.01); *H01L 21/67028* (2013.01); *H01L 21/67253* (2013.01); *H01L 21/67288* (2013.01); *H01L 21/68764* (2013.01); *H01L 22/12* (2013.01);
(Continued)

(58) Field of Classification Search
None
See application file for complete search history.

(56) References Cited

U.S. PATENT DOCUMENTS 4,877,653 A * 10/1989 Vora .................. C08J 7/08
264/331.19
5,625,962 A * 5/1997 Fleissner ............ F26B 13/16
34/446

(Continued)

FOREIGN PATENT DOCUMENTS

JP   2010239013 A   10/2010
JP   2013-012538 A   1/2013
JP   2017069354 A   4/2017

OTHER PUBLICATIONS

Troian et al "Patterning liquid flow on the microscopic scale", Nature, vol. 402, p. 794 (Dec. 16, 1999).

*Primary Examiner* — Charles Capozzi
(74) *Attorney, Agent, or Firm* — Nath, Goldberg & Meyer; Jerald L. Meyer; Tanya E. Harkins

(57) ABSTRACT

There is provided a substrate processing apparatus comprising a liquid amount detecting part configured to detect a liquid amount of a liquid film formed on a substrate; and a coating state detecting part configured to detect a coating state of the substrate with the liquid film formed thereon.

8 Claims, 18 Drawing Sheets

(51) Int. Cl.
  *B08B 7/04* (2006.01)
  *H01L 21/02* (2006.01)
  *H01L 21/66* (2006.01)
  *H01L 21/687* (2006.01)

(52) U.S. Cl.
  CPC ........ *H01L 22/20* (2013.01); *H01L 21/67248* (2013.01)

(56) References Cited

U.S. PATENT DOCUMENTS

| | | |
|---|---|---|
| 6,067,154 A | 5/2000 | Hossain et al. |
| 6,280,690 B1 | 8/2001 | Tadion |
| 6,348,101 B1 | 2/2002 | Walter |
| 6,597,444 B1 | 7/2003 | Haldeman et al. |
| 7,644,512 B1 * | 1/2010 | Liu .................. H01L 21/67034 34/80 |
| 2006/0181706 A1 | 8/2006 | Sweeney |
| 2011/0015773 A1 * | 1/2011 | Wilby ............... H01L 21/67253 700/109 |
| 2012/0255795 A1 * | 10/2012 | Fenske .................. G01G 21/22 177/1 |
| 2013/0094006 A1 | 4/2013 | Ohta et al. |
| 2015/0270146 A1 | 9/2015 | Yoshihara et al. |
| 2015/0273534 A1 | 10/2015 | Ootagaki et al. |
| 2017/0345680 A1 | 11/2017 | Lee et al. |
| 2019/0148192 A1 | 5/2019 | Yamaguchi |

\* cited by examiner

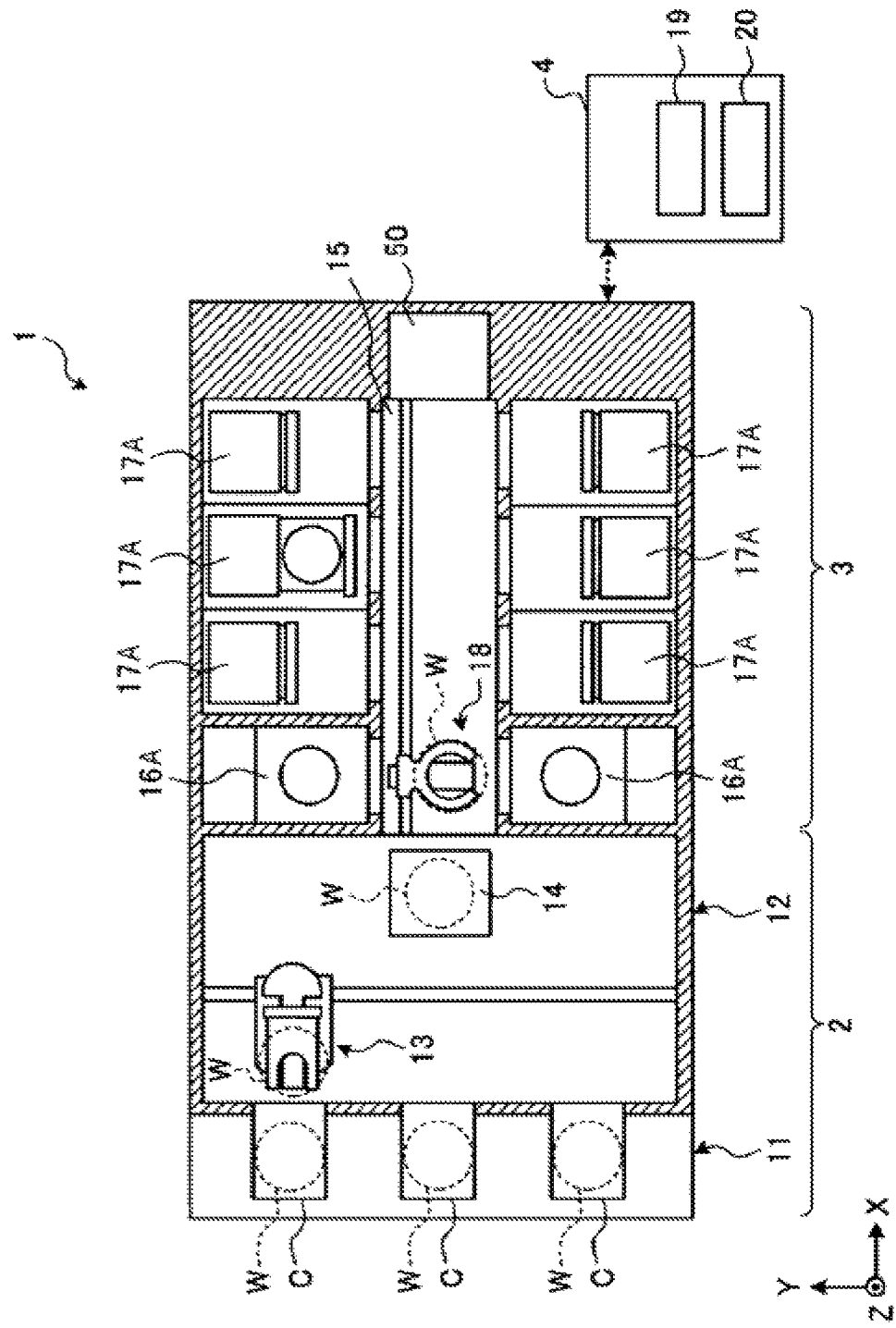

SUBSTRATE PROCESSING APPARATUS AND SUBSTRATE PROCESSING METHOD

CROSS-REFERENCE TO RELATED APPLICATIONS

This is a Continuation Application of U.S. patent application Ser. No. 16/238,236, filed Jan. 2, 2019, an application claiming the benefit from Japanese Application No. 2018000247, filed Jan. 4, 2018, and from Japanese Application No. 2018201615, filed Oct. 26, 2018, the contents of each of which are hereby incorporated by reference in their entirety.

TECHNICAL FIELD

Embodiments of the present disclosure relate to a substrate processing apparatus and a substrate processing method.

BACKGROUND

In the related art, there has been known a substrate processing apparatus which forms a dry-preventing liquid film on a front surface of a substrate, and performs a drying process by bringing the substrate having the liquid film formed thereon into contact with a supercritical fluid.

SUMMARY

However, in the conventional substrate processing apparatus, the drying process is sometimes performed in a state where a liquid film is improperly formed on the substrate. This results in a poor yield of the substrate after the drying process.

Some embodiments of the present disclosure provide a substrate processing apparatus and a substrate processing method that improve the yield of a substrate.

According to one embodiment of the present disclosure, there is provided a substrate processing apparatus including: a liquid amount detecting part configured to detect a liquid amount of a liquid film formed on a substrate; and a coating state detecting part configured to detect a coating state of the substrate with the liquid film formed thereon.

According to another embodiment of the present disclosure, there is provided a substrate processing method, including: detecting a coating state of a substrate with a liquid film formed thereon; detecting a liquid amount of the liquid film when the coating state is a predetermined state in which the liquid film covers a pattern of the substrate; and performing a drying process on the substrate when the liquid amount falls within a predetermined range.

According to another embodiment of the present disclosure, there is provided a substrate processing method, including: detecting a first weight of a substrate having a front surface on which a liquid film is formed before a drying process; detecting a coating state of the substrate with the liquid film formed thereon before the drying process; performing the drying process on the substrate on which the liquid film has been formed; detecting a second weight of the substrate after the drying process; and detecting a state of the front surface of the substrate after the drying process.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 9 is a schematic view showing a configuration of a substrate processing system according to a second embodiment.

DETAILED DESCRIPTION

Hereinafter, embodiments of a substrate processing apparatus and a substrate processing method of the present disclosure will be described in detail with reference to the accompanying figures. Further, the present disclosure is not limited by the embodiments to be described hereafter. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

For the clarification of a positional relationship, there is shown a rectangular coordinate system in which an X-axis direction, a Y-axis direction and a Z-axis direction, which are orthogonal to one another, are defined in the following description and a positive Z-axis direction is defined as a vertical upward direction.

First Embodiment

<Outline of Substrate Processing System>

Figure 1:
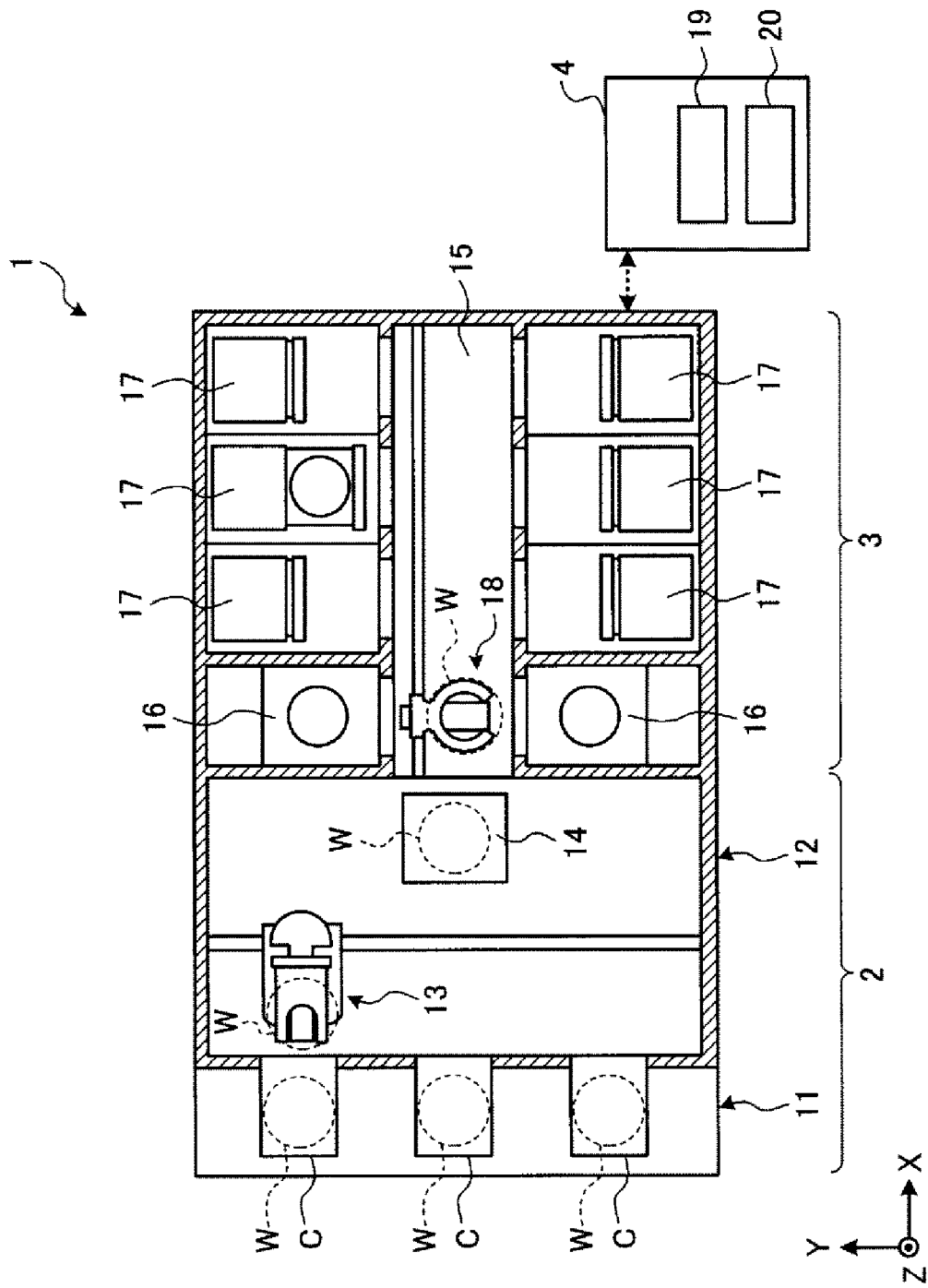
FIG. 1 is a schematic view showing a schematic configuration of a substrate processing system according to a first embodiment.

A substrate processing system 1 according to a first embodiment will be described with reference to FIG. 1. FIG. 1 is a schematic view showing a schematic configuration of the substrate processing system 1 according to the first embodiment.

The substrate processing system 1 includes a loading/unloading station 2 and a processing station 3. The loading/unloading station 2 and the processing station 3 are installed adjacent to each other. The substrate processing system 1 corresponds to a substrate processing apparatus.

The loading/unloading station 2 includes a carrier mounting part 11 and a transfer part 12. A plurality of carriers C, each of which receives a plurality of semiconductor wafers W (hereafter, referred to as wafers W) in a horizontal posture, is mounted on the carrier mounting part 11.

The transfer part 12 is disposed adjacent to the carrier mounting part 11 and includes a substrate transfer device 13 and a delivering part 14 installed therein. The substrate transfer device 13 includes a wafer holding mechanism that holds a wafer W. The substrate transfer device 13 can move in horizontal and vertical directions and can swivel about a vertical axis, so that the substrate transfer device 13 transfers the wafer W between the carrier C and the delivering part 14 using the wafer holding mechanism. An exemplary configuration of the delivering part 14 will be described below.

The processing station 3 is installed adjacent to the transfer part 12. The processing station 3 includes a transfer part 15, a plurality of cleaning process units 16, and a plurality of drying process units 17. The plurality of cleaning process units 16 and the plurality of drying process units 17 are installed in parallel at both sides of the transfer part 15. The arrangements and numbers of the cleaning process units 16 and the drying process units 17 shown in FIG. 1 are examples and are not limited to those shown in the figure.

The transfer part 15 includes a substrate transfer device 18 installed therein. The substrate transfer device 18 includes a wafer holding mechanism that holds the wafer W. The substrate transfer device 18 can move in horizontal and vertical directions and can swivel about a vertical axis, so that the substrate transfer device 18 transfers the wafer W between the delivering part 14, the cleaning process units 16 and the drying process units 17 using the wafer holding mechanism.

The cleaning process unit 16 performs a predetermined cleaning process on the wafer W which is transferred by the substrate transfer device 18. An exemplary configuration of the cleaning process unit 16 will be described below.

The drying process unit 17 performs a predetermined drying process on the wafer W which has been cleaned by the cleaning process unit 16. An exemplary configuration of the drying process unit 17 will be described below.

Further, the substrate processing system 1 includes a control device 4. An exemplary configuration of the control device 4 will be described below.

In the substrate processing system 1 configured as above, first, the substrate transfer device 13 of the loading/unloading station 2 takes out a wafer W from the carrier C mounted on the carrier mounting part 11 and mounts the same on the delivering part 14. The wafer W mounted on the delivering part 14 is picked up by the substrate transfer device 18 of the processing station 3 and is loaded into to the cleaning process unit 16.

The wafer W loaded into the cleaning process unit 16 is subjected to the cleaning process by the cleaning process unit 16. Subsequently, the wafer W is unloaded from the cleaning process unit 16 by the substrate transfer device 18. The wafer W unloaded from the cleaning process unit 16 is loaded into the drying process unit 17 by the substrate transfer device 18. The wafer W is subjected to the drying process by the drying process unit 17.

The wafer W which has been subjected to the drying process by the drying process unit 17 is unloaded from the drying process unit 17 by the substrate transfer device 18 and is then mounted on the delivering part 14. The processed wafer W mounted on the delivering part 14 is returned to the carrier C of the carrier mounting part 11 by the substrate transfer device 13.

<Outline of Delivering Part>

Figure 2:
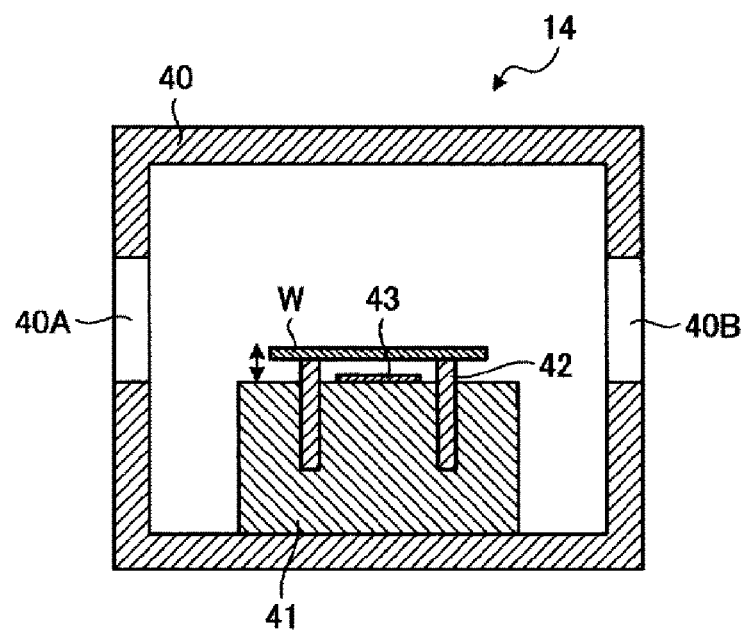
FIG. 2 is a cross-sectional view showing a schematic configuration of a delivering part.

Next, the delivering part 14 will be described with reference to FIG. 2. FIG. 2 is a cross-sectional view showing a schematic configuration of the delivering part 14.

The delivering part 14 includes a case 40, a base 41, a plurality of lifting members 42, and a load cell 43. Openings 40A and 40B through which the wafer W is transferred by the substrate transfer devices 13 and 18 are formed in the case 40. The base 41 is disposed inside the case 40. Insertion holes into which the respective lifting members 42 are inserted are formed in the base 41.

The lifting members 42 are supported by the base 41 so that they can be moved up and down by a lifting drive part (not shown). When the wafer W held by the substrate transfer device 13 and the substrate transfer device 18 is mounted on tip ends of the lifting members 42, the lifting members 42 support a rear surface of the wafer W. When the lifting members 42 are moved down from a predetermined delivery position by the lifting drive part while supporting the wafer W, the wafer W is mounted on the load cell 43. Subsequently, in the state where the wafer W is mounted on the load cell 43, when the lifting members 42 are moved up by the lifting drive part, the lifting members 42 are brought into contact with the rear surface of the wafer W to support the wafer W. Thus, the wafer W is moved up to the delivery position.

The load cell 43 measures the weight of the wafer W mounted thereon from the carrier C or the wafer W which has been subjected to the drying process by the drying process unit 17, and outputs a signal corresponding to the weight of the wafer W to the control device 4.

<Outline of Cleaning Process Unit>

Figure 3:
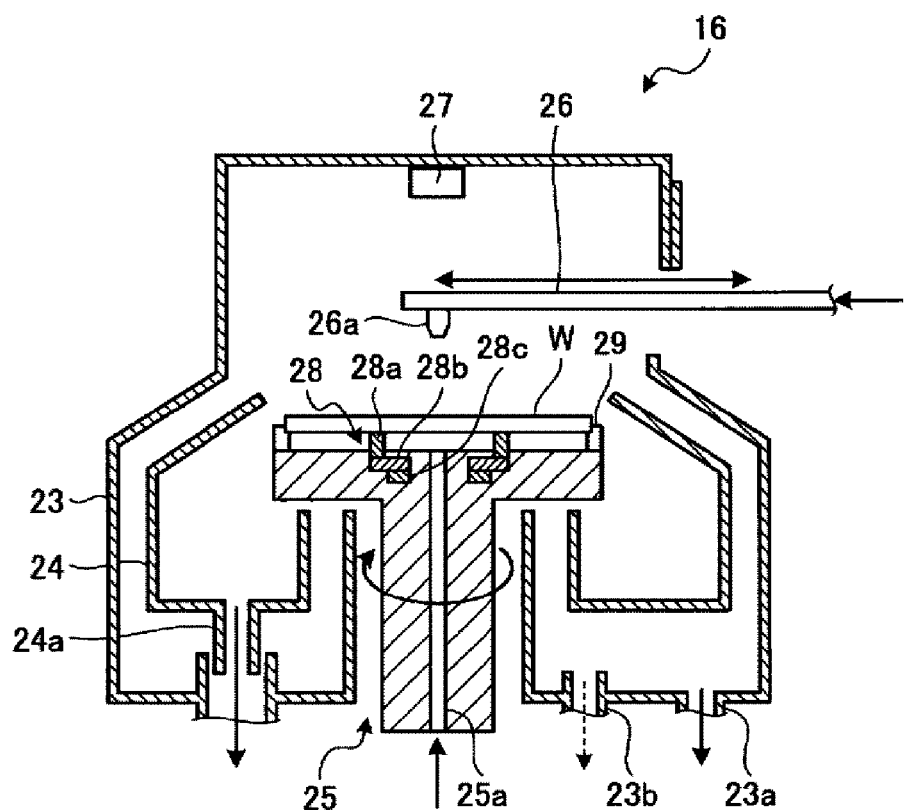
FIG. 3 is a cross-sectional view showing a schematic configuration of a cleaning process unit.

Next, the cleaning process unit 16 will be described with reference to FIG. 3. FIG. 3 is a cross-sectional view showing a schematic configuration of the cleaning process unit 16. The cleaning process unit 16 is, for example, a single-wafer cleaning process unit configured to clean the plurality of wafers W one by one through spin cleaning.

The cleaning process unit 16 includes a wafer holding mechanism 25, a nozzle arm 26, and an infrared sensor 27.

The wafer holding mechanism 25 includes a lifter 28 and a wafer holding part 29. The wafer holding mechanism 25 is disposed inside an outer chamber 23 which provides a processing space. The wafer holding mechanism 25 rotates about a vertical axis while holding the wafer W in a substantially horizontal posture by the wafer holding part 29, thereby rotating the wafer W.

The lifter 28 includes a plurality of lifter pins 28a, a supporting part 28b which is connected to lower ends of the lifter pins 28a to support the lifter pins 28a, and a load cell 28c disposed on a lower surface of the supporting part 28b.

The lifter pins 28a are expanded or contracted in an up-down direction by an expansion/contraction drive part (not shown). The lifter pins 28a deliver the wafer W with respect to the substrate transfer device 18 at an upper delivery position. Further, the lifter pins 28a deliver the wafer W with respect to the wafer holding part 29 at a lower delivery position. The lifter pins 28a is brought into contact with the rear surface of the wafer W to support the wafer W. When the lifter pins 28a are further contracted while holding the wafer W by the wafer holding part 29, they are separated from the rear surface of the wafer W.

The load cell 28c measures the weight of the wafer W supported by the lifter pins 28a. The load cell 28c measures the weight of the wafer W before the cleaning process is performed on the wafer W and the weight of the wafer W after the cleaning process is performed on the wafer W. The load cell 28c outputs signals corresponding to the weights of the wafer W to the control device 4.

In some embodiments, the lifter pins 28a may be non-extendible rod-shaped members. In this case, the lifter pins 28a, the supporting part 28b and the load cell 28c of the lifter 28 are formed as a unit and are moved up and down.

The wafer holding part 29 holds the wafer W in a substantially horizontal posture. The wafer holding mechanism 25 rotates the wafer W by rotating about a vertical axis while holding the wafer W with the wafer holding part 29.

The infrared sensor 27 measures a temperature of the wafer W which has been subjected to the cleaning process, and outputs a signal corresponding to the measured temperature of the wafer W to the control device 4. The infrared sensor 27 measures the temperature of the wafer W in the state where the wafer W is held by the wafer holding part 29. Further, the infrared sensor 27 may measure the temperature of the wafer W in the state where the wafer W is supported by the lifter pins 28a.

In some embodiments, the infrared sensor 27 may be installed at plural locations. For example, in a case where one infrared sensor 27 is not able to detect the temperature of the entire area of the wafer W, the temperature of the entire area of the wafer W can be detected by the plurality of infrared sensors 27.

The nozzle arm 26 advances above the wafer W under rotation, and supplies a chemical solution, a rinse solution, an acid chemical solution, and IPA in a predetermined order from a chemical solution nozzle 26a installed at a tip end of the nozzle arm 26, thus performing the cleaning process on a front surface of the wafer W. The nozzle arm 26 may be installed at plural locations. Further, in the case where the infrared sensor 27 measures the temperature of the wafer W, the nozzle arm 26 moves backward so as not to interfere with the measurement by the infrared sensor 27.

Further, the cleaning process unit 16 includes a chemical solution supply channel 25a formed inside the wafer holding mechanism 25. The rear surface of the wafer W is cleaned by the chemical solution or the rinse solution supplied through the chemical solution supply channel 25a.

For example, the cleaning process performed on the wafer W includes initially removing particles or organic contaminants by an SCl solution (a mixed solution of ammonia and hydrogen peroxide) as an alkaline chemical solution, followed by rinse-cleaning with a deionized water (hereafter, referred to as DIW) as a rinse solution, followed by removing a natural oxide film by a diluted hydrofluoric acid solution (hereafter, referred to as DHF) as an acid chemical solution, followed by rinse-cleaning with DIW.

Various chemical solutions described above are received in the outer chamber 23 or an inner cup 24 disposed inside the outer chamber 23, and are discharged from a liquid drain port 23a formed in the bottom of the outer chamber 23 or a liquid drain port 24a formed in the bottom of the inner cup 24. Further, an internal atmosphere of the outer chamber 23 is exhausted from an exhaust port 23b formed in the bottom of the outer chamber 23.

After the above rinsing process is performed on the wafer W, IPA staying in a liquid state (hereafter, referred to as "IPA liquid") is supplied to the surface and rear surfaces of the wafer W while the wafer holding mechanism 25 rotates. Thus, the DIW remaining on both the front and rear surfaces of the wafer W is replaced with the IPA liquid. Thereafter, the rotation of the wafer holding mechanism 25 is slowly stopped. As a result, the IPA liquid collects on the front surface of the wafer W so that a liquid film L is formed by the IPA liquid (see FIGS. 7A and 7B). The liquid film L is formed to cover the entire pattern of the wafer W.

The wafer W which has been subjected to the cleaning process in this way is transferred onto the substrate transfer device 18 by the lifter 28 in the state where the liquid film L made of the IPA liquid is formed on the front surface of the wafer W, and is unloaded from the cleaning process unit 16.

The IPA liquid collecting on the front surface of the wafer W functions as an anti-drying liquid that prevents the pattern from collapsing due to evaporation (vaporization) of liquid existing on the front surface of the wafer W in the course of transferring the wafer W from the cleaning process unit 16 to the drying process unit 17 or in the course of loading the wafer W into the drying process unit 17.

The wafer W which has been subjected to the cleaning process in the cleaning process unit 16 and on which the liquid film L of the IPA liquid is formed, is transferred to the drying process unit 17. In the drying process unit 17, a processing fluid of $CO_2$ staying in a supercritical state (hereafter, referred to as a "supercritical fluid") is brought into contact with the IPA liquid on the front surface of the wafer W. Thus, the IPA liquid is removed by being dissolved in the supercritical fluid. In this state, a process of drying the wafer W is performed.

<Outline of Drying Process Unit>

Figure 4:
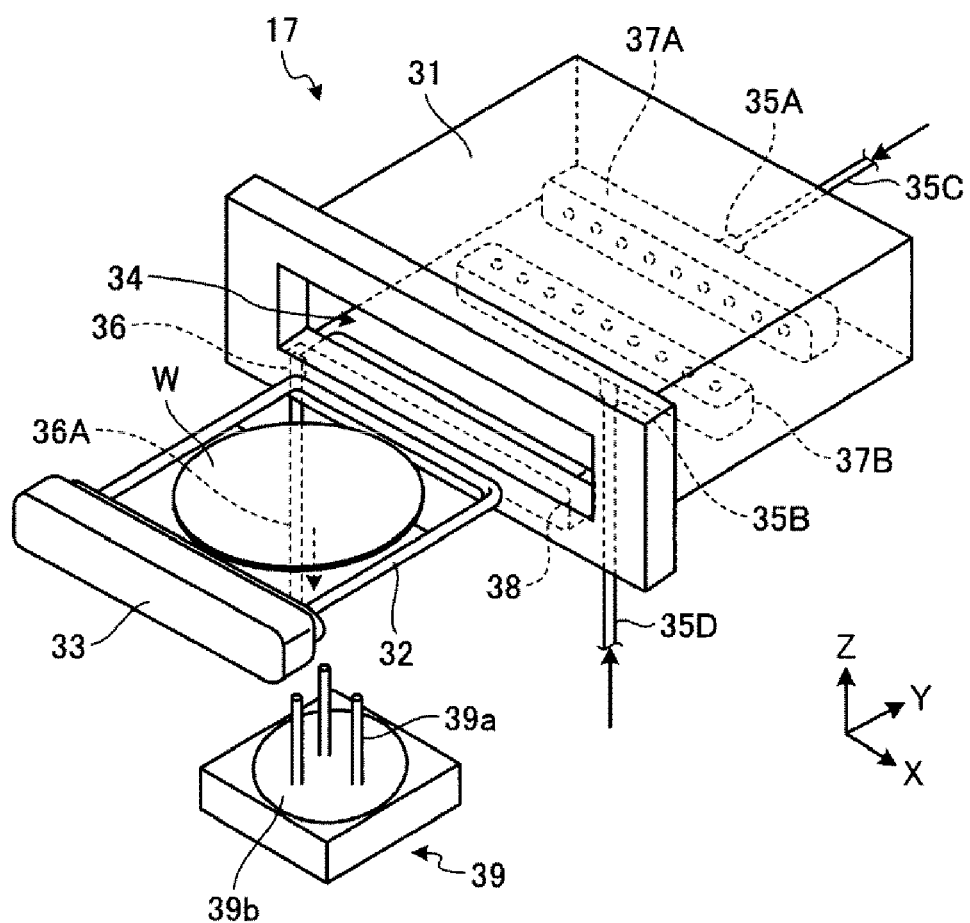
FIG. 4 is an external perspective view showing a configuration of a drying process unit.

Next, the configuration of the drying process unit 17 will be described with reference to FIG. 4. FIG. 4 is an external perspective view showing the configuration of the drying process unit 17.

The drying process unit 17 includes a housing-shaped main body 31, a holding plate 32, a cover member 33, and a lifter 39. An opening 34 through which the wafer W is transferred is formed in the main body 31. The holding plate 32 horizontally holds the wafer W to be processed. The cover member 33 supports the holding plate 32, and closes the opening 34 when the wafer W is loaded into the main body 31.

The main body 31 is a container having a processing space where the wafer W can be received, and has supply ports 35A and 35B and a discharge port 36 formed in a wall portion thereof. The supply port 35A is connected to a supply line 35C for supplying the supercritical fluid into the processing space. The supply port 35B is connected to a supply line 35D for supplying the supercritical fluid into the processing space. The discharge port 36 is connected to a discharge line 36A for discharging the supercritical fluid from the processing space.

The supply port 35A is connected to a side opposite to the opening 34 in the housing-shaped main body 31. Further, the supply port 35B is connected to the bottom of the main body 31. Further, the discharge port 36 is connected to a portion under the opening 34. Although the two supply ports 35A and 35B and the single discharge port 36 are shown in FIG. 4, the numbers of the supply ports 35A and 35B and the discharge port 36 are not particularly limited.

Fluid supply headers 37A and 37B and a fluid discharge header 38 are disposed inside the main body 31. A plurality of holes is formed in each of the fluid supply headers 37A and 37B and the fluid discharge header 38.

The fluid supply header 37A is connected to the supply port 35A and is installed adjacent to a side opposite to the opening 34 in the housing-shaped main body 31. Further, the plurality of holes formed in the fluid supply header 37A face the opening 34.

The fluid supply header 37B is connected to the supply port 35B and is installed at the center portion of the bottom of the housing-shaped main body 31. Further, the plurality of holes formed in the fluid supply header 37B is arranged to be oriented upward.

The fluid discharge header 38 is connected to the discharge port 36 and is installed adjacent to a side close to the opening 34 and under the opening 34 inside the housing-shaped main body 31. Further, the plurality of holes formed in the fluid discharge header 38 face the fluid supply header 37A.

The fluid supply headers 37A and 37B supply the supercritical fluid into the main body 31. The fluid discharge header 38 introduces and discharges the supercritical fluid received in the main body 31 outward of the main body 31. Further, the IPA liquid dissolved in the supercritical fluid on the front surface of the wafer W is included in the supercritical fluid that is discharged outward of the main body 31 through the fluid discharge header 38.

The lifter 39 includes a plurality of lifter pins 39*a* and a supporting part 39*b* connected with lower ends of the lifter pins 39*a* to support a delivery member. The lifter 39 is moved up and down by a lifting drive part (not shown).

The lifter 39 is moved up and down between a delivery position where the wafer W is delivered between the lifter 39 and the substrate transfer device 18, and a standby position. The standby position is a lower position where the cover member 33 can be opened and closed.

Figure 5A:
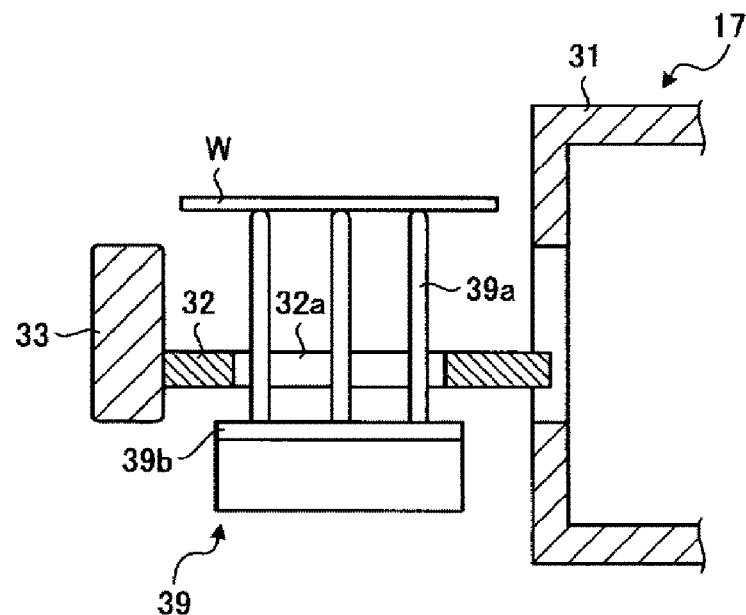
FIG. 5A is a schematic cross-sectional view showing a portion of the drying process unit at a delivery position.
Figure 5B:
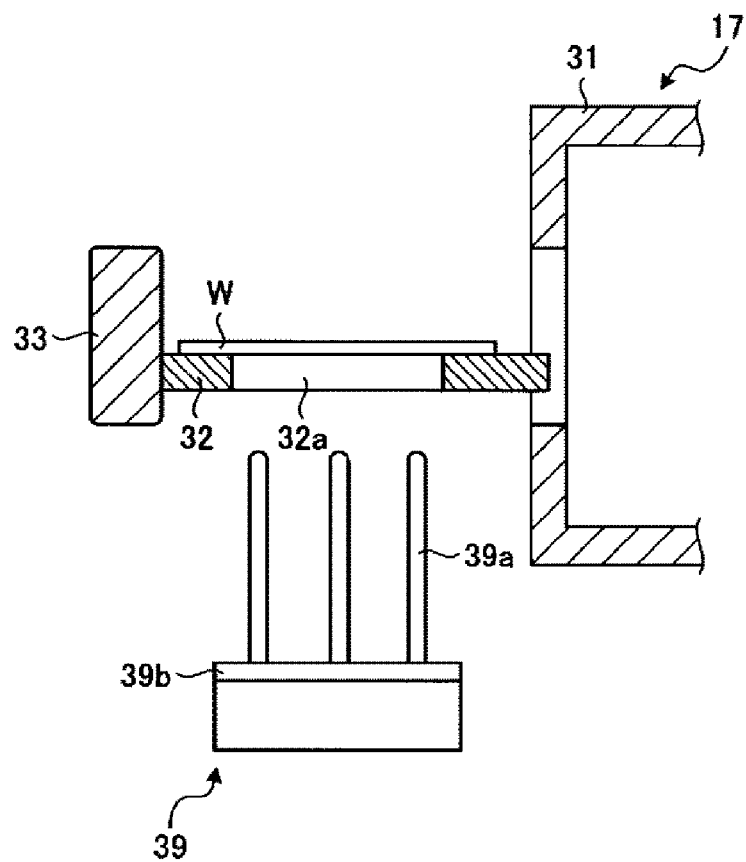
FIG. 5B is a schematic cross-sectional view showing a portion of the drying process unit at a standby position.

The lifter 39 receives the wafer W from the substrate transfer device 18 at the delivery position shown in FIG. 5A. The lifter 39 supports the rear surface of the wafer W using the lifter pins 39*a*. The lifter 39 is moved down to the standby position shown in FIG. 5B while supporting the wafer W by the lifter pins 39*a*, thus mounting the wafer W on the holding plate 32. FIG. 5A is a schematic cross-sectional view showing a portion of the drying process unit 17 at the delivery position. FIG. 5B is a schematic cross-sectional view showing a portion of the drying process unit 17 at the standby position.

Further, after the drying process is finished, the lifter 39 is moved up from the standby position shown in FIG. 5B to support the rear surface of the wafer W with the lifter pins 39*a* and receive the wafer W from the holding plate 32. The lifter 39 is moved up to the delivery position shown in FIG. 5A while supporting the rear surface of the wafer W by the lifter pins 39*a* and deliver the wafer W to the substrate transfer device 18. The lifter pins 39*a* are arranged to be inserted into an insertion hole 32*a* of the holding plate 32.

The drying process unit 17 further includes a pressing mechanism (not shown). The pressing mechanism has a function of sealing the processing space by pressing the cover member 33 toward the main body 31 against an internal pressure caused by the supercritical fluid staying in a supercritical state, which is supplied into the processing space of the main body 31. In some embodiments, an insulator or a tape heater may be installed on the surface of the main body 31 to keep the supercritical fluid supplied into the processing space at a predetermined temperature.

The wafer W which has been subjected to the drying process in the drying process unit 17 is transferred to the delivering part 14 by the substrate transfer device 18.

<Configuration of Control Device>

Figure 6:
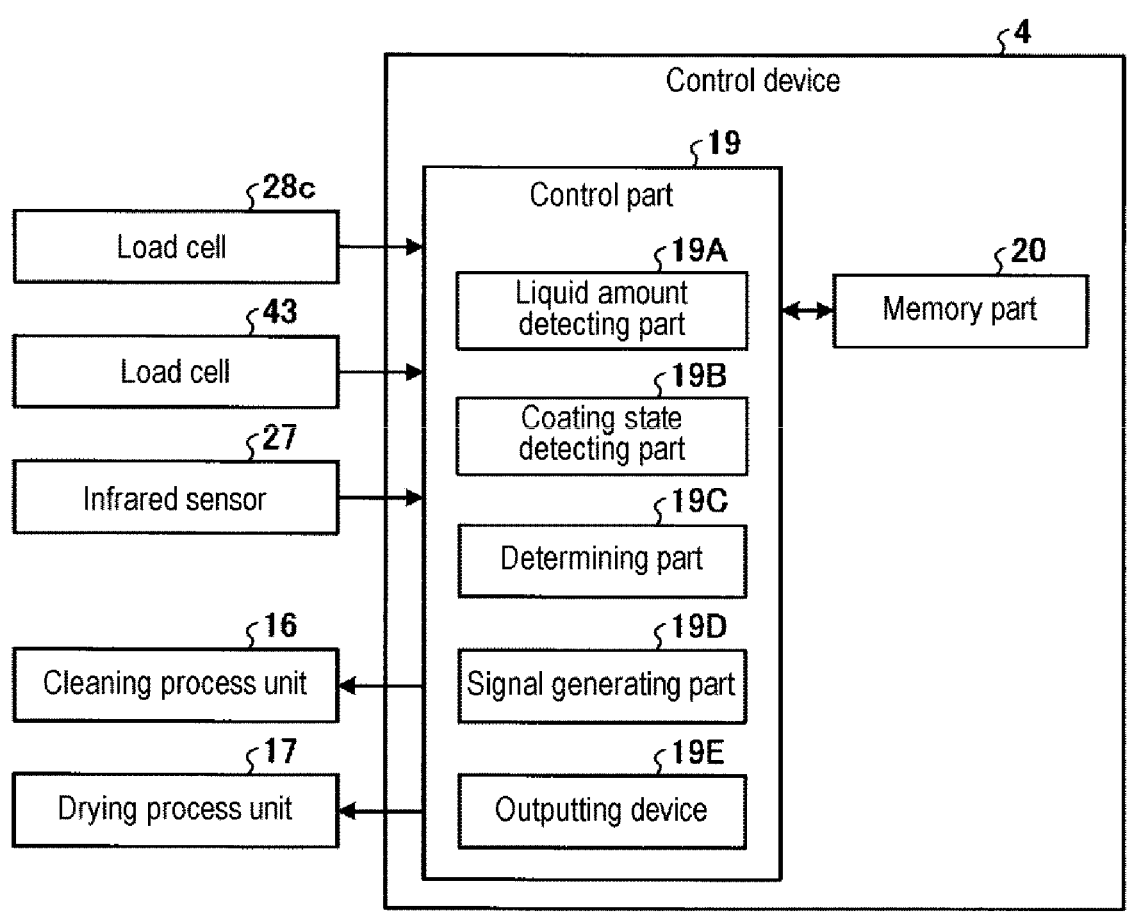
FIG. 6 is a schematic block diagram of a control device according to the first embodiment.

Next, the configuration of the control device 4 will be described with reference to FIG. 6. FIG. 6 is a schematic block diagram of the control device 4 according to the first embodiment.

The control device 4 is, for example, a computer and includes a control part 19 and a memory part 20.

The control part 19 includes a microcomputer composed of a central processing unit (CPU), a read only memory (ROM), a random access memory (RAM), an input/output port and the like, and various circuits. The CPU of such a microcomputer controls the transfer part 12 (see FIG. 1), the transfer part 15 (see FIG. 1), the cleaning process unit 16, and the drying process unit 17 and the like by reading out and executing programs stored in the ROM.

Further, the programs are recorded in a computer-readable recording medium and may be installed on the memory part 20 of the control device 4 from the recording medium. An example of the computer-readable recording medium may include a hard disk (HD), a flexible disk (FD), a compact disc (CD), a magnet-optical disk (MO), a memory card or the like.

The memory part 20 is implemented, for example, by a semiconductor memory device such as a RAM, a flash memory or the like, or a storage device such as a hard disk, an optical disc or the like. The memory part 20 stores the weights of the wafer W measured by the load cells 28*c* and 43.

The control part 19 includes a liquid amount detecting part 19A, a coating state detecting part 19B, a determining part 19C, a signal generating part 19D, and an outputting part 19E. Signals corresponding to the weights of the wafer W which are measured by the load cells 28c and 43 are inputted to the control part 19. A signal corresponding to the temperature of the wafer W which is detected by the infrared sensor 27 is inputted to the control part 19. Further, the control part 19 outputs signals for controlling the cleaning process unit 16, the drying control unit 17 and the like.

The liquid amount detecting part 19A detects a liquid amount of the liquid film L made of the IPA liquid (hereafter, referred to as a "liquid amount of the liquid film L"), which is formed on the wafer W by the cleaning process. Specifically, the liquid amount detecting part 19A calculates a difference between a weight of the wafer W after the cleaning process and a weight of the wafer W before the cleaning process, which are measured by the load cell 28c, and detects the liquid amount of the liquid film L formed on the wafer W on the basis of the calculated difference.

Further, the liquid amount detecting part 19A detects a dried state of the wafer W after the drying process. Specifically, the liquid amount detecting part 19A calculates a difference between a weight of the wafer W after the drying process, which is measured by the load cell 43 and a weight of the wafer W before the cleaning process, which is measured by the load cell 28c, and detects the dried state of the wafer W on the basis of the calculated difference.

The coating state detecting part 19B detects a coating state of the wafer W on which the liquid film L of an IPA liquid is formed. Specifically, the coating state detecting part 19B detects a temperature distribution based on the temperature of the wafer W measured by the infrared sensor 27. Subsequently, the coating state detecting part 19B detects the coating state on the basis of the detected temperature distribution.

In the case of detecting the temperature of the wafer W on which the liquid film L is formed, a temperature of a portion with the liquid film L is different from that of a portion without the liquid film L. This is because the wafer W permits infrared rays to pass through the portion without the liquid film L so that a temperature of a member under the wafer W, for example, the wafer holding mechanism 25, is measured.

Figure 7A:
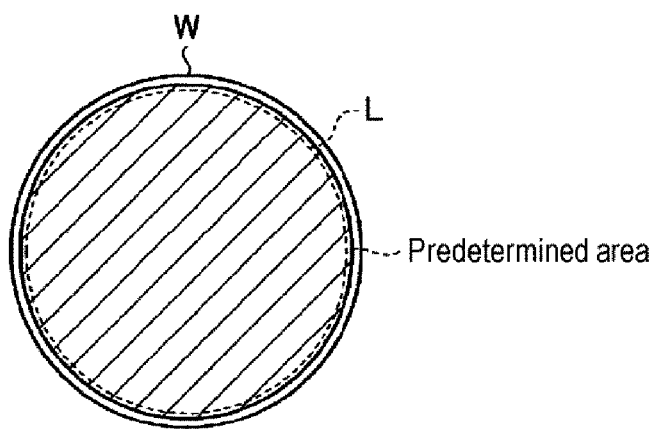
FIG. 7A is a schematic view showing a state in which no defective portion is generated in a liquid film formed of an IPA liquid.

For example, in a case where the liquid film L is appropriately formed on the wafer W, a temperature of the liquid film L is measured at a predetermined area of the wafer W, as hatched in FIG. 7A. FIG. 7A is a schematic view showing a state in which no defective portion Wa (see FIG. 7B) is generated in the liquid film L of the IPA liquid. The predetermined area is an area including all areas where a pattern is formed.

Figure 7B:
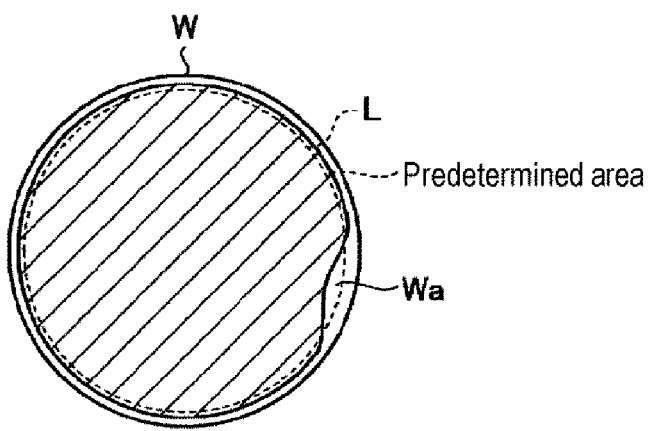
FIG. 7B is a schematic view showing a state in which a defective portion is generated in a liquid film formed of an IPA liquid.

As shown in FIG. 7B, in a case where the liquid film L is not appropriately formed on the wafer W and a defective portion Wa where the liquid film L is not formed is generated at a predetermined area, for example, a temperature of the wafer holding mechanism 25 is measured at the defective portion Wa. FIG. 7B is a schematic view showing a state in which the defective portion Wa is generated in the liquid film L of the IPA liquid.

As described above, the coating state detecting part 19B detects the coating state of the wafer W on the basis of the temperature distribution of the wafer W measured by the infrared sensor 27.

The determining part 19C determines whether or not the liquid amount of the liquid film L formed on a wafer W is normal. Specifically, the determining part 19C determines whether or not the liquid amount of the liquid film L falls within a first predetermined range. The first predetermined range is a preset range in which pattern collapse or particles that cause a defective wafer do not occur in the wafer W after the drying process. If it is determined that the liquid amount of the liquid film L falls within the first predetermined range, the determining part 19C determines that the liquid amount of the liquid film L is normal. If it is determined that the liquid amount of the liquid film L falls outside the first predetermined range, the determining part 19C determines that the liquid amount of the liquid film L is abnormal.

Further, the determining part 19C determines whether or not the dried state of the wafer W is normal. Specifically, the determining part 19C determines whether or not a difference between a weight of the wafer W before the drying process and a weight of the wafer W before the cleaning process falls within a second predetermined range. The second predetermined range is a preset range and is a value at which it is possible to determine the wafer W has been dried. If it is determined that the different falls within the second predetermined range, the determining part 19C determines that the wafer W has been dried and the dried state is normal. If it is determined that the different falls outside the second predetermined range, the determining part 19C determines that the wafer W has not been dried and the dried state is abnormal.

Further, the determining part 19C determines whether or not the coating state of the wafer W is normal. Specifically, the determining part 19C determines whether the defective portion Wa exists in a predetermined area. If it is determined that there is no defective portion Wa in the predetermined area, the determining part 19C determines that the coating state of the wafer W is normal. If it is determined that the defective portion Wa exists in the predetermined area, the determining part 19C determines that the coating state of the wafer W is abnormal.

The signal generating part 19D generates a signal for regulating the liquid film L on the wafer W to the cleaning process unit 16 when the liquid amount of the liquid film L is abnormal or when the coating state is abnormal. For example, the signal generating part 19D generates a signal for supplying the IPA liquid again.

In some embodiments, the signal generating part 19D may generate a signal for regulating the supply amount of the IPA liquid so that the liquid amount of the liquid film L or the coating state becomes normal in a subsequent cleaning process. For example, when the liquid amount of the liquid film L is insufficient, the signal generating part 19D generates a signal for increasing the liquid amount of the IPA liquid that is to be supplied to the wafer W so that the liquid amount of the liquid film L falls within the first predetermined range. Accordingly, it is possible to make the liquid amount of the liquid film L or the coating state normal in the subsequent cleaning process, thus efficiently performing the substrate process.

When the dried state of the wafer W is abnormal, the signal generating part 19D generates a signal for returning the wafer W to the cleaning process unit 16 where the wafer W is subjected to a sequence of processes starting from the cleaning process again. Further, the signal generating part 19D may generate a signal for regulating the drying process so that the dried state of the wafer W becomes normal in a subsequent drying process. The signal generating part 19D, for example, generates a signal for lengthening a time period of the drying process.

The outputting part 19E outputs the signal generated by the signal generating part 19D to the cleaning process unit 16 or the drying process unit 17.

<Substrate Process>

Figure 8:
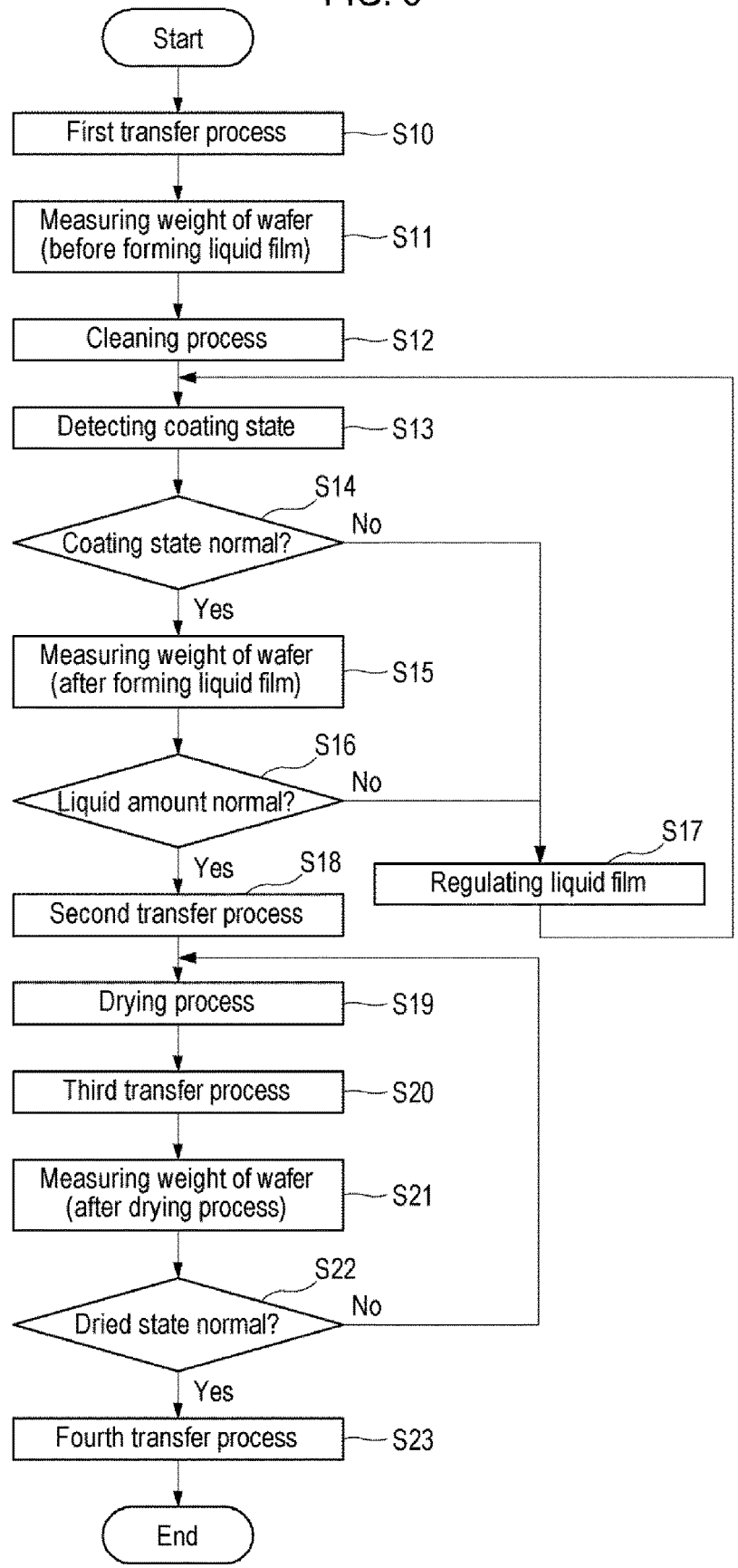
FIG. 8 is a flowchart illustrating a substrate process in the first embodiment.

Next, the substrate process according to the first embodiment will be described with reference to FIG. 8. FIG. 8 is a flowchart illustrating the substrate process according to the first embodiment.

The substrate processing system 1 performs a first transfer process (S10). The substrate processing system 1 transfers the wafer W to the cleaning process unit 16 from the carrier C through the delivering part 14 using the substrate transfer device 13 and the substrate transfer device 18. The substrate processing system 1 mounts the wafer W on the lifter pins 28a of the lifter 28.

The substrate processing system 1 measures the weight of the wafer W before the cleaning process, namely before the liquid film L of the IPA liquid is formed on the wafer W, using the load cell 28c.

The substrate processing system 1 performs the cleaning process (S12). The substrate processing system 1 measures the weight of the wafer W before the liquid film L of the IPA liquid is formed, and then delivers the wafer W to the wafer holding part 29 from the lifter pins 28a. Thus, the wafer W is held by the wafer holding part 29. The substrate processing system 1 removes contaminants and performs a rinse-cleaning process. Further, the substrate processing system 1 supplies the IPA liquid for a predetermined period of time at a predetermined flow rate to form the liquid film L of the IPA liquid on the front surface of the wafer W.

The substrate processing system 1 detects a coating state (S13). The substrate processing system 1 measures a temperature of the wafer W using the infrared sensor 27 and detects the coating state on the basis of temperature distribution of the wafer W.

The substrate processing system 1 determines whether or not the coating state is normal (S14). If it is determined that the coating state is normal (Yes in S14), the substrate processing system 1 measures the weight of the wafer W on which the liquid film L of the IPA liquid is formed, using the load cell 28c (S15). The substrate processing system 1 delivers the wafer W to the lifter pins 28a from the wafer holding part 29 such that the wafer W is supported by the lifter pins 28a, and measures the weight of the wafer W on which the liquid film L of the IPA liquid is formed.

The substrate processing system 1 determines whether or not the liquid amount of the liquid film L is normal (S16). If it is determined that the coating state is abnormal (No in S14) or that the liquid amount of the liquid film L is abnormal (No in S16), the substrate processing system 1 regulates the liquid film L of the IPA liquid formed on the wafer W (S17). The substrate processing system 1 detects the coating state after regulating the liquid film L of the IPA liquid (S13).

If it is determined that the liquid amount of the liquid film L is normal (Yes in S16), the substrate processing system 1 performs a second transfer process (S18). The substrate processing system 1 transfers the wafer W from the cleaning process unit 16 to the drying process unit 17 using the substrate transfer device 18 to load the wafer W into the drying process unit 17.

The substrate processing system 1 performs a drying process (S19) and subsequently, performs a third transfer process (S20). The substrate processing system 1 transfers the wafer W from the drying process unit 17 to the delivering part 14 using the substrate transfer device 18 to mount the wafer W on the delivering part 14.

The substrate processing system 1 measures the weight of the wafer W after the drying process using the load cell 43 (S21).

The substrate processing system 1 determines whether or not the dried state of the wafer W is normal (S22). If it is determined that the dried state of the wafer W is abnormal (No in S22), the substrate processing system 1 performs the cleaning process again (S12). The substrate processing system 1 transfers the wafer W from the delivering part 14 to the cleaning process unit 16 using the substrate transfer device 18. In the cleaning process unit 16, the liquid film L of the IPA liquid is formed on the front surface of the wafer W.

If it is determined that the dried state of the wafer W is normal (Yes in S22), the substrate processing system 1 performs a fourth transfer process (S23). The substrate processing system 1 transfers the wafer W from the delivering part 14 to the carrier C using the substrate transfer device 13.

The substrate processing system 1 detects a liquid amount of the liquid film L formed on the wafer W using the liquid amount detecting part 19A, and detects a coating state of the wafer W on which the liquid film L of the IPA liquid is formed, using the coating state detecting part 19B. Accordingly, the substrate processing system 1 can detect whether the liquid film L of the IPA liquid has been appropriately formed on the wafer W, which improves the yield of the wafer W after the drying process.

The substrate processing system 1 measures the weight of the wafer W before and after the liquid film L of the IPA liquid is formed, using the same load cell 28c, and detects a liquid amount of the liquid film L on the basis of the measured weights. Accordingly, it is possible to suppress influence of a measurement error by the load cell and to accurately detect the liquid amount of the liquid film L, as compared with a case where the liquid amount of the liquid film L is detected using different load cells.

The substrate processing system 1 performs the drying process on the wafer W on which the liquid film L of the IPA liquid is formed. Specifically, if it is determined that the coating state of the wafer W is normal and the liquid amount of the liquid film L is normal, the substrate processing system 1 performs the drying process. Accordingly, the substrate processing system 1 can suppress pattern collapse in the wafer W after the drying process and can prevent generation of particles in the wafer W after the drying process, which improves the yield of the wafer W.

The substrate processing system 1 detects the liquid amount of the liquid film L before the wafer W is transferred to the drying process unit 17, specifically in the case where the wafer W is loaded into the cleaning process unit 16. Accordingly, in the case where the liquid amount of the liquid film L is abnormal, the substrate processing system 1 can regulate the liquid film L of the IPA liquid in the cleaning process unit 16. Therefore, the substrate processing system 1 can regulate the liquid film L of the IPA liquid without unloading the wafer W from the cleaning process unit 16, which shortens a period of time required to regulate the liquid film L.

The substrate processing system 1 detects the coating state of the wafer W before the wafer W is transferred to the drying process unit 17, specifically in the state where the wafer W is loaded into the cleaning process unit 16. Accordingly, in the case where the coating state of the wafer W is abnormal, the substrate processing system 1 can regulate the liquid film L of the IPA liquid in the cleaning process unit 16. Therefore, the substrate processing system 1 can regulate the liquid film L of the IPA liquid without unloading the wafer W from the cleaning process unit 16, which shortens a period of time required to regulate the liquid film L.

The substrate processing system 1 detects the coating state of the wafer W using the infrared sensor 27. Accordingly, in the case where the defective portion Wa is generated in the liquid film L of the IPA liquid, it is possible to accurately detect the generation of the defective portion Wa.

Second Embodiment

<Outline of Substrate Processing System>

Next, a substrate processing system according to a second embodiment will be described with reference to FIG. 9. FIG. 9 is a schematic view showing the schematic configuration of the substrate processing system according to the second embodiment. Here, the substrate processing system according to the second embodiment will be described with a focus on the differences from the substrate processing system 1 according to the first embodiment, and the description of the same configuration as the substrate processing system 1 according to the first embodiment will be omitted.

The substrate processing system according to the second embodiment includes a regulating unit 50 configured to regulate a liquid film L of the IPA liquid. The regulating unit 50 regulates the liquid film L of the IPA liquid when a liquid amount of the liquid film L is abnormal or a coating state is abnormal.

The regulating unit 50 is installed adjacent to the transfer part 15. The wafer W can be transferred by the substrate transfer device 18.

The load cell 43 (see FIG. 2) installed in the delivering part 14 measures a weight of the wafer W transferred by the carrier C. That is to say, the load cell 43 measures the weight of the wafer W before the cleaning process is performed.

Further, a cleaning process unit 16A of the substrate processing system according to the second embodiment does not include the load cell 28c and the infrared sensor 27 of the cleaning process unit 16 according to the first embodiment.

<Outline of Drying Process Unit>

Figure 10A:
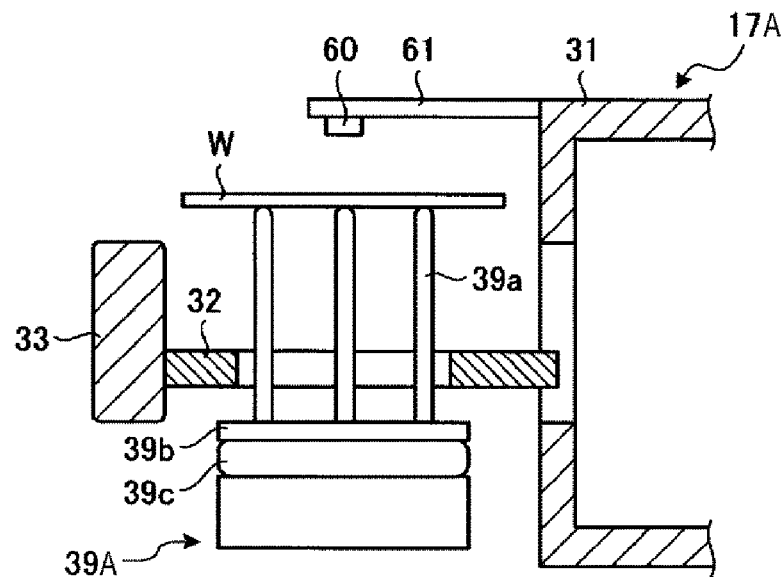
FIG. 10A is a schematic cross-sectional view showing a portion of a drying process unit according to the second embodiment.

As shown in FIG. 10A, a drying process unit 17A according to the second embodiment further includes a load cell 39c and an infrared sensor 60. FIG. 10A is a schematic cross-sectional view showing a portion of the drying process unit 17A according to the second embodiment.

The load cell 39c is installed on a lower surface of a supporting part 39b of a lifter 39A. As shown in FIG. 10A, the load cell 39c measures a weight of the wafer W in a state where the wafer W is supported by lifter pins 39a. The load cell 39c measures a weight of the wafer W on which the liquid film L of the IPA liquid is formed and a weight of the wafer W after the drying process.

Figure 10B:
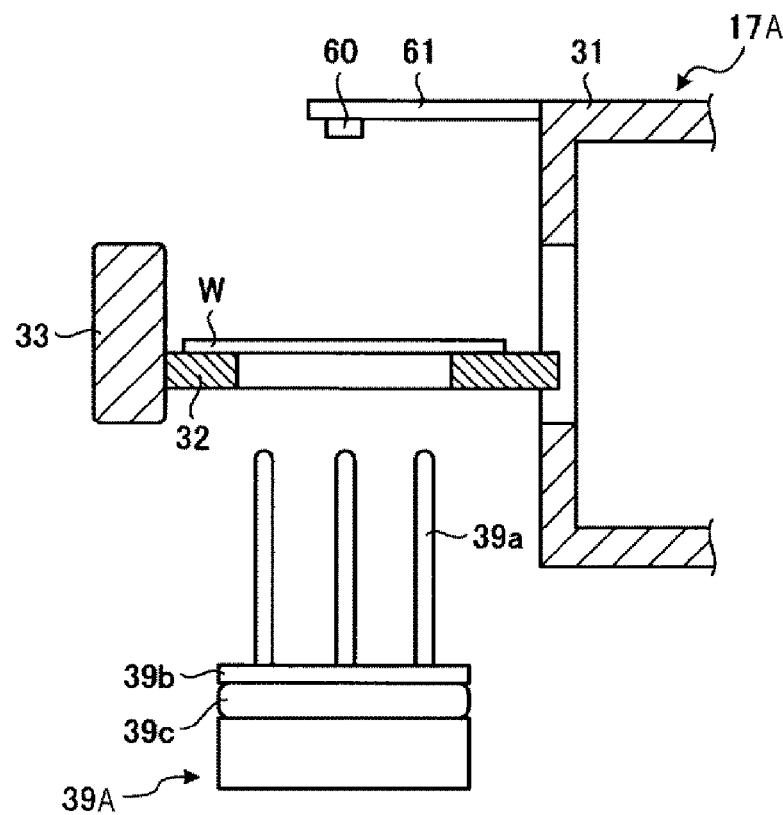
FIG. 10B is a schematic cross-sectional view of the drying process unit, which represents a state in which a wafer W is mounted on a holding plate.

The infrared sensor 60 is installed at an upper portion of a main body 31 through a support arm 61. As shown in FIG. 10B, the infrared sensor 60 measures a temperature of the wafer W in a state where the wafer W is mounted on a holding plate 32. FIG. 10B is a schematic cross-sectional view of the drying process unit 17A, which shows a state where the wafer W is mounted on the holding plate 32.

<Outline Control Device>

Figure 11:
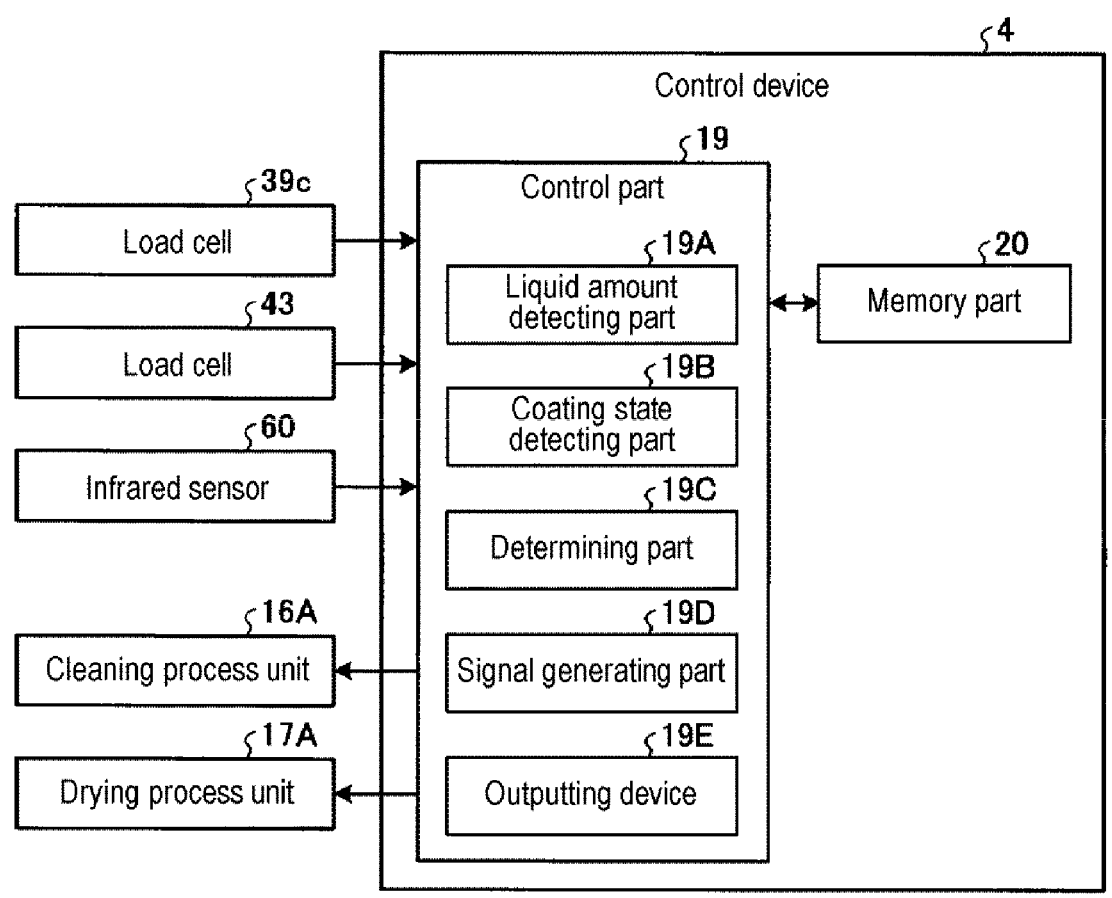
FIG. 11 is a schematic block diagram of a control device according to the second embodiment.

As shown in FIG. 11, signals corresponding to the weight of the wafer W, which are measured by the load cells 39c and 43, are inputted to a control part 19 of the control device 4. Further, a signal corresponding to the temperature of the wafer W, which is detected by the infrared sensor 60, is inputted to the control part 19. FIG. 11 is a schematic block diagram of the control device 4 according to the second embodiment.

A liquid amount detecting part 19A calculates a difference between a weight of the wafer W after the cleaning process, which is measured by the load cell 39c, and a weight of the wafer W before the cleaning process, which is measured by the load cell 43, and detects a liquid amount of the liquid film L formed on the wafer W.

Further, the liquid amount detecting part 19A calculates a difference between a weight of the wafer W after the drying process, which is measured by the load cell 39c, and a weight of the wafer W before the cleaning process, which is measured by the load cell 43, and detects a dried state of the wafer W.

The substrate processing system according to the second embodiment measures a liquid amount of the liquid film L and a coating state after the wafer W on which the liquid film L of the IPA liquid is formed is transferred to the drying process unit 17 by the substrate transfer device 18.

Figure 12:
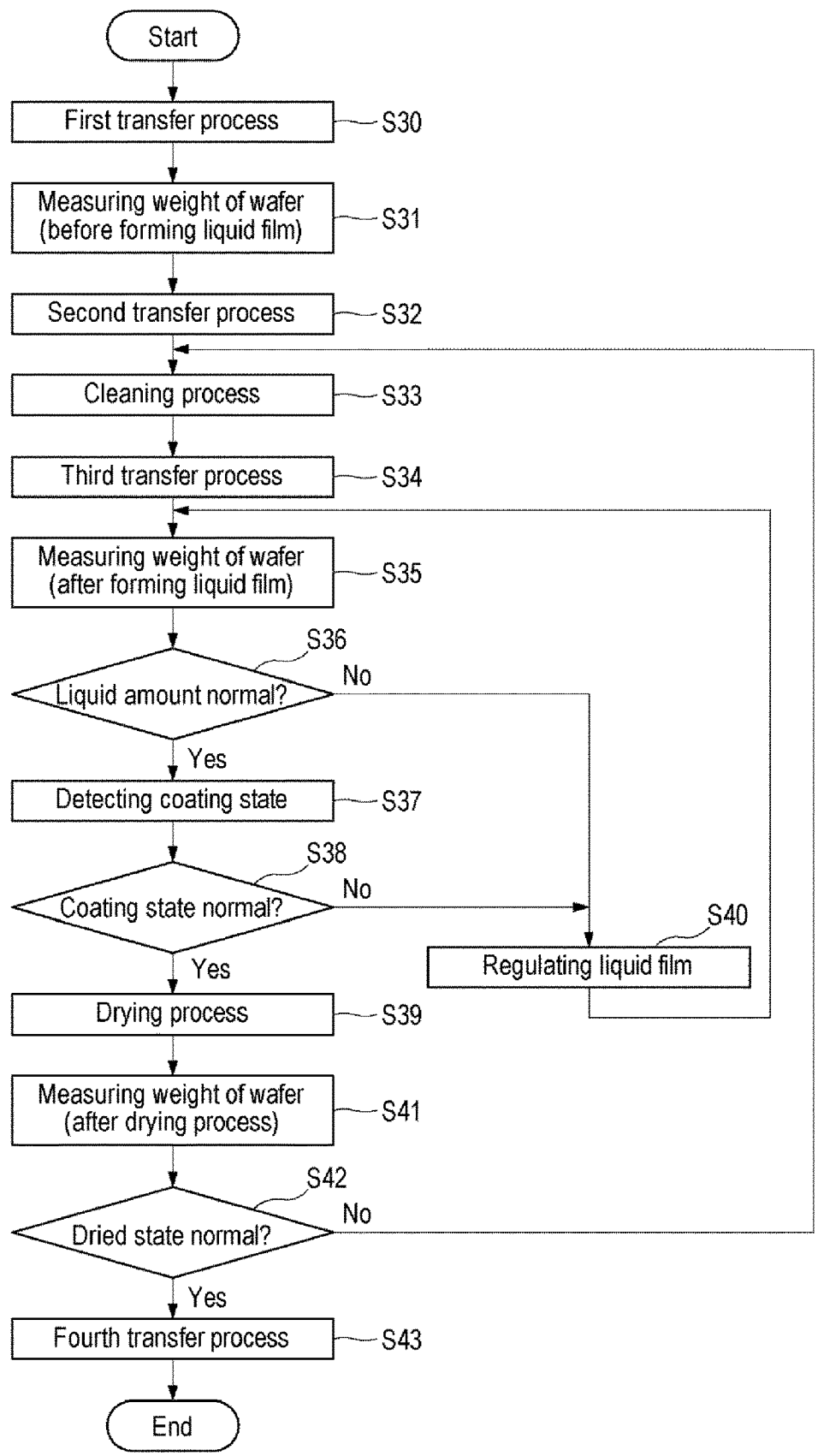
FIG. 12 is a flowchart illustrating a substrate process according to the second embodiment.

Next, a substrate process according to the second embodiment will be described with reference to FIG. 12. FIG. 12 is a flowchart illustrating the substrate process according to the second embodiment.

The substrate processing system according to the second embodiment performs a first transfer process (S30). The substrate processing system according to the second embodiment transfers the wafer W from the carrier C to the delivering part 14 using the substrate transfer device 13.

The substrate processing system according to the second embodiment measures a weight of the wafer W before a cleaning process, namely before the liquid film L of the IPA liquid is formed on the wafer W, using the load cell 43 (S31).

The substrate processing system according to the second embodiment performs a second transfer process (S32). The substrate processing system according to the second embodiment transfers the wafer W from the delivering part 14 to the cleaning process unit 16 using the substrate transfer device 18.

The substrate processing system according to the second embodiment performs the cleaning process (S33). The substrate processing system according to the second embodiment removes contaminants and subsequently performs a rinse-cleaning process. Further, the substrate processing system according to the second embodiment supplies the IPA liquid to the wafer W to form a liquid film L of the IPA liquid on the front surface of the wafer W.

The substrate processing system according to the second embodiment performs a third transfer process (S34). The substrate processing system according to the second embodiment transfers the wafer W from the cleaning process unit 16 to the drying process unit 17 using the substrate transfer device 18. The substrate processing system according to the second embodiment delivers the wafer W onto the lifter pins 39a of the lifter 39A from the substrate transfer device 18.

The substrate processing system according to the second embodiment measures a weight of the wafer W on which the liquid film L of the IPA liquid is formed, using the load cell 39c (S35).

The substrate processing system according to the second embodiment determines whether or not a liquid amount of the liquid film L is normal (S36). If it is determined that the liquid amount of the liquid film L is normal (Yes in S36), the substrate processing system according to the second embodiment detects a coating state (S37). The substrate processing system according to the second embodiment measures a temperature of the wafer W using the infrared sensor 60 and detects the coating state on the basis of temperature distribution of the wafer W.

The substrate processing system according to the second embodiment determines whether or not the coating state is normal (S38). If it is determined that the coating state is normal (Yes in S38), the substrate processing system according to the second embodiment performs the drying process (S39).

If it is determined that the liquid amount of the IPA liquid is abnormal (No in S36) or that the coating state is abnormal (No in S38), the substrate processing system according to the second embodiment transfers the wafer S to the regulating unit 50 so that the regulating unit 50 regulates the liquid film L of the IPA liquid formed on the wafer W (S40). The substrate processing system according to the second embodiment transfers the wafer W having the regulated liquid film L to the drying process unit 17 and measures a weight of the wafer S (S35).

The substrate processing system according to the second embodiment measures a weight of the wafer W after the drying process using the load cell 39c (S41).

The substrate processing system according to the second embodiment determines whether or not a dried state is normal (S42). If it is determined that the dried state of the wafer W is abnormal (No in S42), the substrate processing system 1 performs the cleaning process again (S33).

If it is determined that the dried state of the wafer W is normal (Yes in S42), the substrate processing system according to the second embodiment performs a fourth transfer process (S43). The substrate processing system according to the second embodiment transfers the wafer W to the delivering part 14 using the substrate transfer device 18, and subsequently transfers the wafer W to the carrier C from the delivering part 14 using the substrate transfer device 13.

The substrate processing system according to the second embodiment detects the liquid amount of the liquid film L after the wafer W on which the liquid film L of the IPA liquid is formed is transferred to the drying process unit 17. Accordingly, the substrate processing system according to the second embodiment can detect the liquid amount of the liquid film L immediately before the drying process. Therefore, it is possible to prevent the drying process from being performed, for example, in a state where the liquid amount of the liquid film L is small due to overflow or volatilization of the IPA liquid in the course of transferring the wafer W to the drying process unit 17A by the substrate transfer device 18. Accordingly, the substrate processing system according to the second embodiment can prevent the occurrence of pattern collapse.

The substrate processing system according to the second embodiment detects the coating state of the wafer W after the wafer W on which the liquid film L of the IPA liquid is formed is transferred to the drying process unit 17. Accordingly, the substrate processing system according to the second embodiment can detect the coating state of the wafer W immediately before the drying process. Therefore, it is possible to prevent the drying process from being performed, for example, in a state where the defective portion Wa (see FIG. 7B) is generated in the liquid film L of the IPA liquid due to overflow or volatilization of the IPA liquid in the course of transferring the wafer W to the drying process unit 17 by the substrate transfer device 18. Accordingly, the substrate processing system according to the second embodiment can prevent the occurrence of pattern collapse.

Third Embodiment

Next, a substrate processing system according to a third embodiment will be described. Herein, the substrate processing system according to the third embodiment will be described with a focus on the differences from the substrate processing system according to the second embodiment, and the description of the same configuration as the substrate processing system according to the second embodiment will be omitted. The substrate processing system according to the third embodiment detects a coating state of the wafer W on which the liquid film L of the IPA liquid is formed, using an imaging device 72 instead of the infrared sensor 60.

<Outline of Drying Process Unit>

Figure 13:
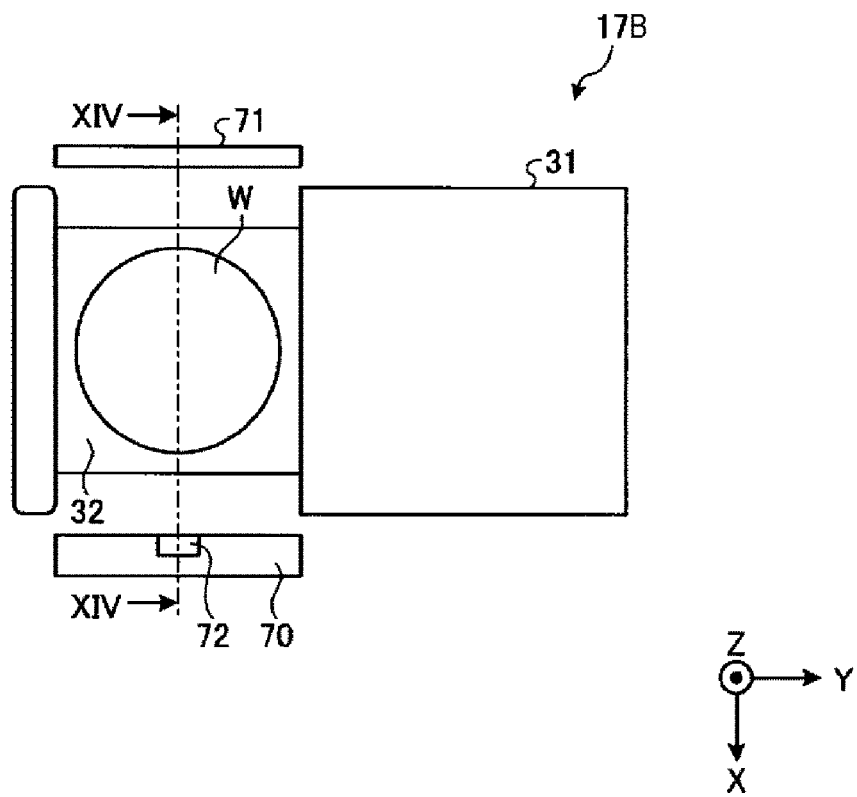
FIG. 13 is a schematic plan view of a drying process unit according to a third embodiment.
Figure 14:
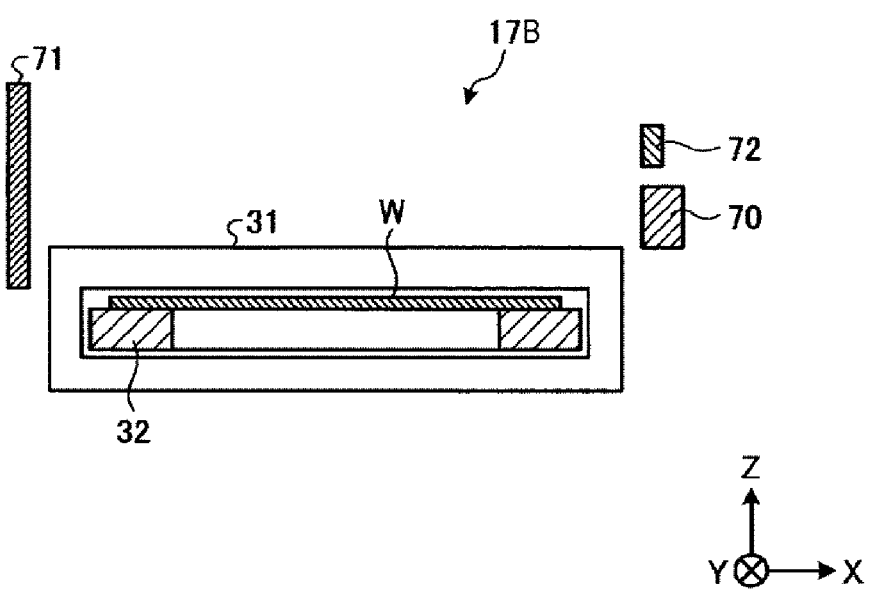
FIG. 14 is a schematic cross-sectional view showing a portion of the drying process unit taken along line XIV-XIV of FIG. 13.

As shown in FIGS. 13 and 14, a drying process unit 17B further includes a laser irradiation part 70, a screen 71, and the imaging device 72. FIG. 13 is a schematic plan view of the drying process unit 17B according to the third embodiment. FIG. 14 is a schematic cross-sectional view showing a portion of the drying process unit 17B taken along line XIV-XIV of FIG. 13.

The laser irradiation part 70 irradiates a laser beam to the wafer W on which the liquid film L of the IPA liquid is formed and that is held on the holding plate 32. The laser irradiation part 70 irradiates a plurality of laser beams to the wafer W. The laser irradiation part 70 irradiates the laser beams to the wafer W held on the holding plate 32 in a downwardly inclined direction.

The screen 71 is disposed to face the laser irradiation part 70 with the wafer W held on the holding plate 32 sandwiched between the screen 71 and the laser irradiation part 70. Reflected beams generated when the laser beams are reflected by the wafer W and the holding plate 32 are projected on the screen 71.

For example, the imaging device 72 is disposed above the laser irradiation part 70. The imaging device 72 is, for example, a digital camera, and picks up the reflected beams projected on the screen 71. Image data of the reflected beams picked up by the imaging device 72 is transmitted to the control device 4.

The laser irradiation part 70 and the imaging device 72, and the screen 71 are aligned in an X-axis direction. Further, positions of the laser irradiation part 70 and the imaging device 72, and the screen 71 are not limited to the above arrangement. For example, the laser irradiation part 70 and the imaging device 72, and the screen 71 may be aligned in a Y-axis direction.

In the drying process unit 17B, the wafer W on which the liquid film L of the IPA liquid is formed on is mounted on the holding plate 32 by the lifter 39A (see FIG. 10A, etc.), and subsequently, the laser beams are irradiated to the wafer W from the laser irradiation part 70. The drying process unit 17B picks up the reflected beams projected on the screen 71 using the imaging device 72.

In some embodiments, the drying process unit 17B may pick up reflected beams generated by irradiating the laser beams with respect to the wafer W supported by the lifter 39A.

Figure 15:
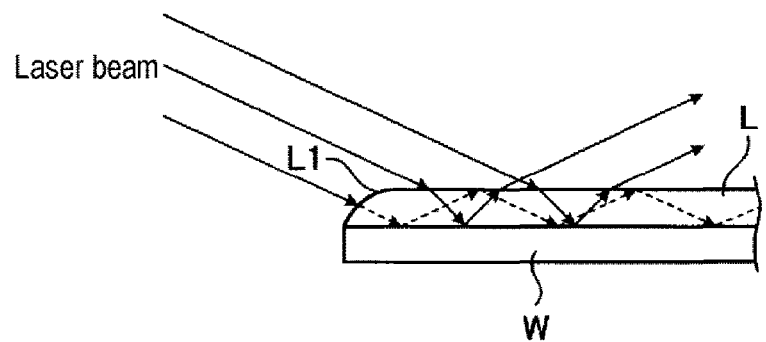
FIG. 15 is a schematic view showing reflection of laser beams from a wafer on which a liquid film formed of an IPA liquid is formed.

When the laser beams are irradiated in a downwardly inclined direction to the wafer W on which the liquid film L of the IPA liquid is formed, the laser beams are refracted at an interface between the IPA liquid and the air and then reflected by the wafer W. Further, the reflected beams are emitted from the IPA liquid, as indicated by solid lines in FIG. 15. FIG. 15 is a schematic view showing a state where the laser beams are reflected from the wafer W on which the liquid film L of the IPA liquid is formed.

A laser beam incident on an edge portion L1 of the liquid film L made of the IPA liquid has various optical conditions such as an incident angle and a refraction angle, which are different from laser beams incident on a central portion inward of the edge portion L1 of the wafer W. Accordingly, for example, the laser beam incident on the edge portion L1 of the liquid film L of the IPA liquid at the side of the laser irradiation part 70 is totally reflected at the interface between the liquid film L of the IPA liquid and the air, as indicated by a dotted line in FIG. 15.

As described above, the reflected beam of the laser beam incident on the edge portion L1 of the liquid film L of the IPA liquid shows a behavior different from those of the laser beams incident on portions closer to the central side rather than the edge portion L1 of the wafer W. Accordingly, depending to the edge portion L1 of the liquid film of the IPA liquid, an area with low intensity of light or an area in which the reflected beams are disturbed (hereafter, referred to as "disturbed area") is manifested on the reflected beams projected onto the screen 71.

Figure 16A:
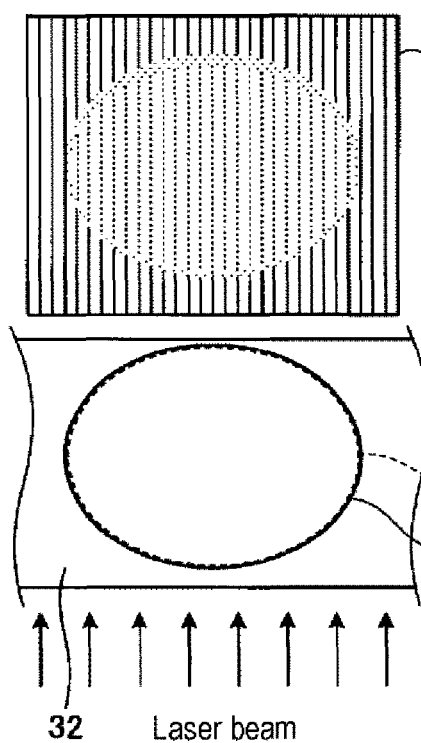
FIG. 16A is a schematic view showing reflected beams in a state where no defective portion is generated in a liquid film formed of an IPA liquid.

For example, in the case where no defective portion Wa is generated in the liquid film L of the IPA liquid, a substantially elliptical disturbed area is manifested on the screen 71 depending to the edge portion L1 of a circular liquid film L of the IPA liquid, as indicated by dots in FIG. 16A. FIG. 16A is a schematic view showing the reflected beams in the state where no defective portion Wa is not generated in the liquid film L of the IPA liquid. Further, in FIG. 16A, reflected beams generated at the portions closer to the central side rather than the edge portion L1 of the liquid film L of the IPA liquid are indicated by dotted lines, and reflected beams reflected at the holding plate 32 are indicated by solid lines.

Figure 16B:
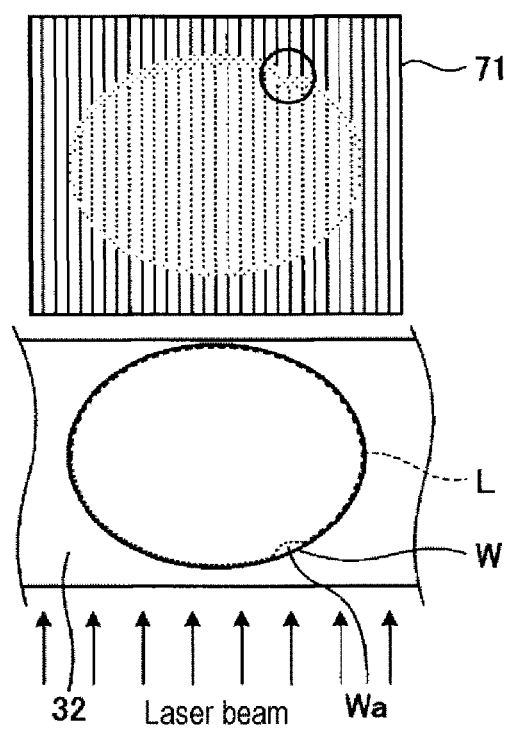
FIG. 16B is a schematic view showing reflected beams in a state where a defective portion is generated in a liquid film formed of an IPA liquid.

Meanwhile, in the case where the defective portion Wa is generated in the liquid film L of the IPA liquid, as shown in a circle in FIG. 16B, an uneven disturbed area corresponding to the defective portion Wa is manifested instead of showing the disturbed area in a substantially elliptical shape. FIG. 16B is a schematic view showing the reflected beams in the case where the defective portion Wa is generated in the liquid film L of the IPA liquid. Further, in FIG. 16B, the disturbed area is indicated by dots, the reflected beams reflected at the portions closer to the central side rather than the edge portion L1 of the liquid film L of the IPA liquid are indicated by dotted liens, and reflected beams reflected at the holding plate 32 or the wafer W are indicated by solid lines.

Thus, it is possible to detect whether or not the defective portion Wa is generated by irradiating laser beams to the wafer W on which the liquid film L of the IPA liquid is formed and picking up the reflected beams projected onto the screen 71.

<Configuration of Control Device>

Figure 17:
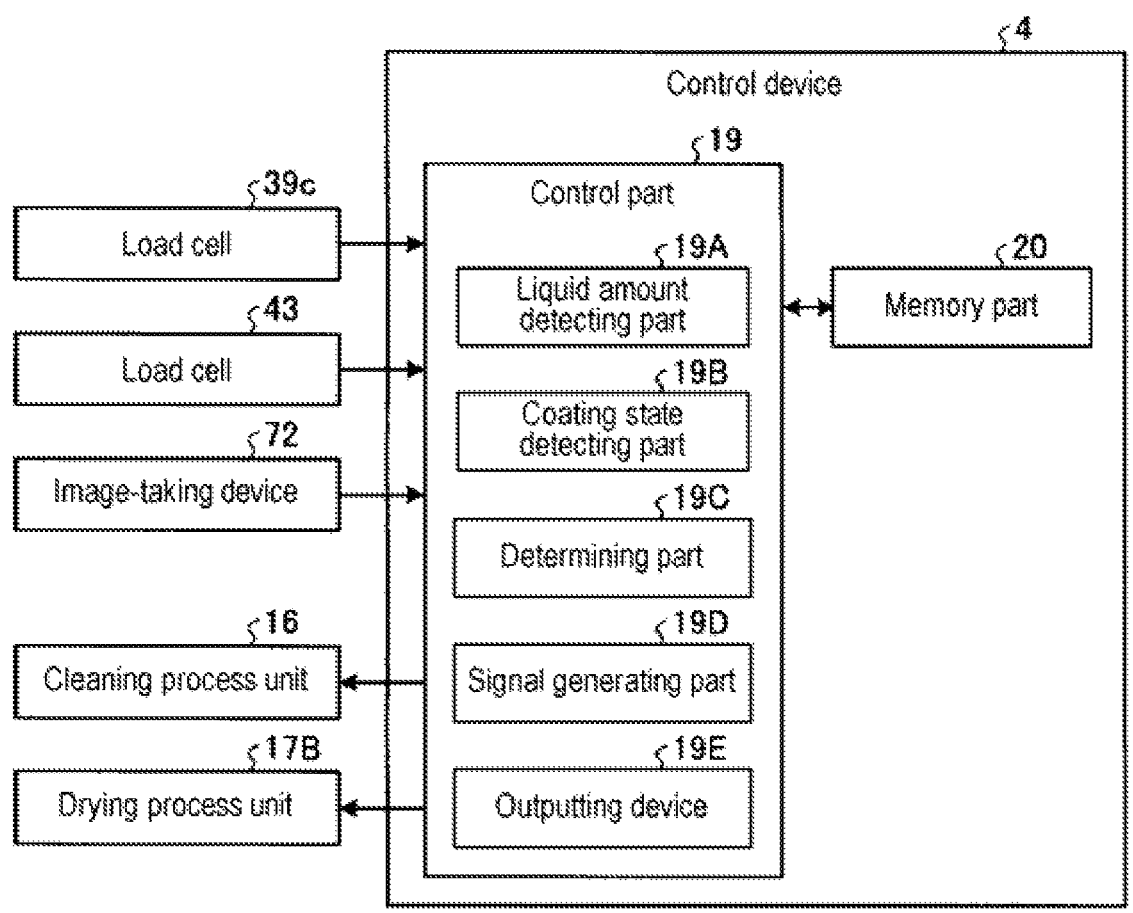
FIG. 17 is a schematic block diagram of a control device according to the third embodiment.

As shown in FIG. 17, an image data obtained by picking up the reflected beams by the imaging device 72 is inputted to the control part 19 of the control device 4. FIG. 17 is a schematic block diagram of the control device 4 according to the third embodiment.

The coating state detecting part 19B detects a coating state of the wafer W on the basis of the image data of the reflected beams, which is obtained by the imaging device 72. Specifically, the coating state detecting part 19B compares an image data of reflected beams, which is picked up in a state where no defective portion Wa is generated in the liquid film L of the IPA liquid, and an image data of reflected beams, which is picked up in the current process, and detects the coating state of the wafer W based on the comparison result. Further, the image data of the reflected beams, which is picked up in the state where no defective portion Wa is generated in the liquid film L of the IPA liquid, is stored in advance in the memory part 20.

The determining part 19C determines whether or not the coating state of the wafer W is normal. Specifically, the determining part 19C determines whether the defective portion Wa exists in a predetermined area on the basis of the detection result obtained by the coating state detecting part 19B.

<Substrate Process>

A substrate process according to the third embodiment will be described with a focus on the differences from the substrate process according to the second embodiment, and the description of the same process as the substrate process according to the second embodiment will be omitted.

The substrate process of a substrate processing system according to the third embodiment includes detecting a coating state of the wafer W on the basis of the image data of obtained by picking up reflected beams by the imaging device 72 (S37).

The substrate processing system according to the third embodiment irradiates the laser beams to the wafer W on which the liquid film L of the IPA liquid is formed, using the laser irradiation part 70, and picks up the reflected beams projected onto the screen 71 using the imaging device 72. Further, the substrate processing system according to the third embodiment detects the coating state of the wafer W on the basis of the obtained image data of the reflected beams.

Accordingly, when the defective portion Wa is generated in the liquid film L of the IPA liquid, the substrate processing system according to the third embodiment can accurately detect the generation of the defective portion Wa. Further, the substrate processing system according to the third embodiment can prevent the drying process from being performed in the state where the defective portion Wa is generated in the liquid film L of the IPA liquid. Accordingly, the substrate processing system according to the third embodiment can suppress the occurrence of pattern collapse.

Fourth Embodiment

Next, a substrate processing system according to a fourth embodiment will be described. Here, the substrate processing system according to the fourth embodiment will be described with a focus on the differences from the substrate processing system according to the second embodiment, and the description of the same configuration as the substrate processing system according to the second embodiment will be omitted. The substrate processing system according to the fourth embodiment detects a coating state of the wafer W on which the liquid film L of the IPA liquid is formed, using an imaging device 72 instead of the infrared sensor 60.

<Outline of Drying Process Unit>

Figure 18:
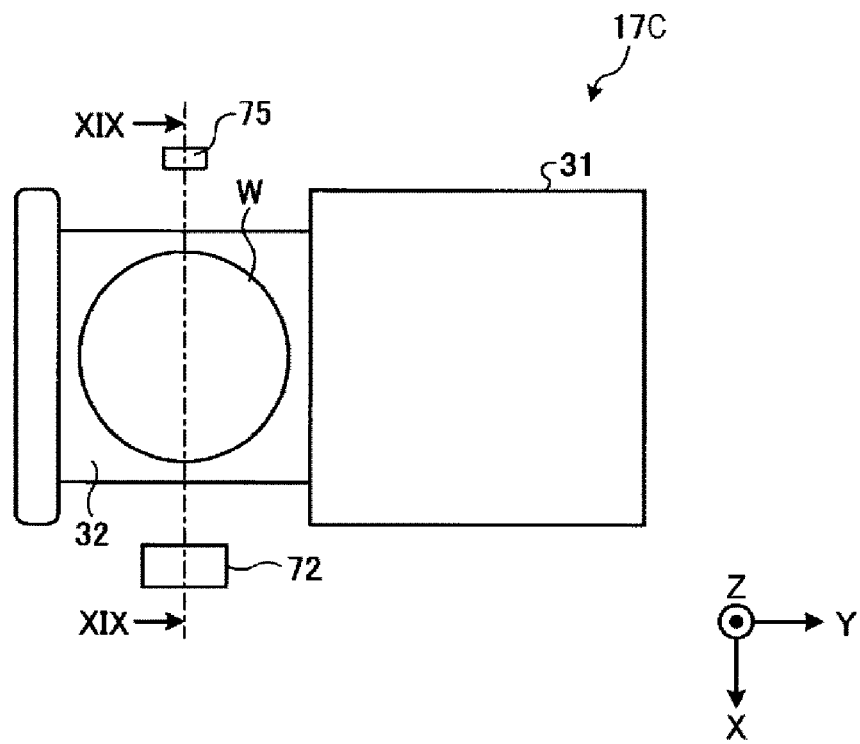
FIG. 18 is a schematic plan view of a drying process unit according to a fourth embodiment.
Figure 19:
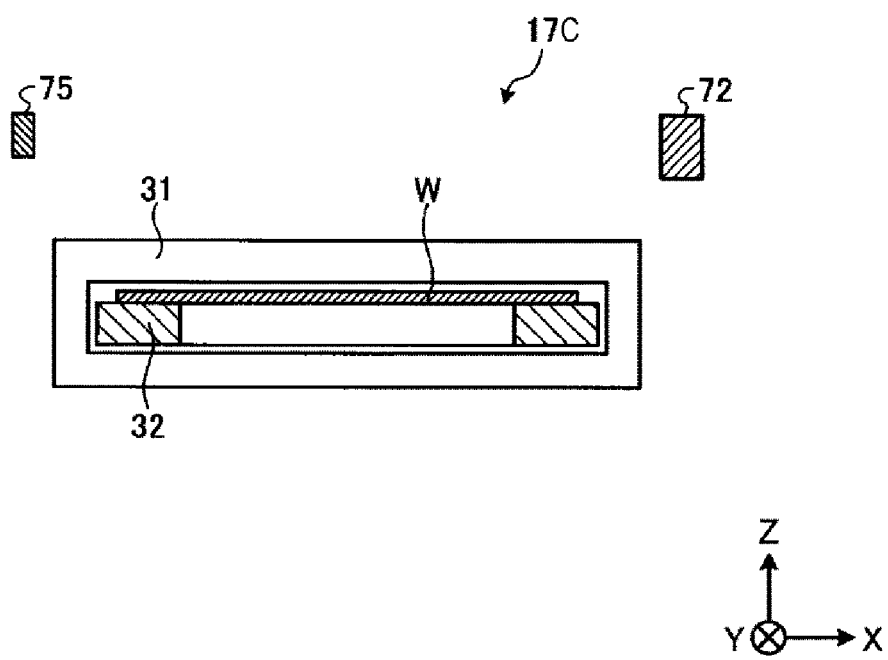
FIG. 19 is a schematic cross-sectional view showing a portion of the drying process unit taken along line XIX-XIX of FIG. 18.

As shown in FIGS. 18 and 19, a drying process unit 17C according to the fourth embodiment further includes a monochromatic beam irradiating part 75 and an imaging device 72. FIG. 18 is a schematic plan view of the drying process unit 17C according to the fourth embodiment. FIG. 19 is a schematic cross-sectional view showing a portion of the drying process unit 17C taken along line XIX-XIX of FIG. 18.

The monochromatic beam irradiating part 75 is, for example, a sodium lamp. The monochromatic beam irradiating part 75 irradiates monochromatic beams to the wafer W on which the liquid film L of the IPA liquid is formed and that is held on the holding plate 32. The monochromatic beam irradiating part 75 irradiates the monochromatic beams to the wafer W held on the holding plate 32 in a downwardly inclined direction.

The imaging device 72 is disposed to face the monochromatic beam irradiating part 75 with the wafer W held on the holding plate 32 sandwiched between the imaging device 72 and the monochromatic beam irradiating part 75. The imaging device 72 picks up the wafer W on which the liquid film L of the IPA liquid is formed. Image data of the wafer W picked up by the imaging device 72 is transmitted to the control device 4.

The drying process unit 17C mounts the wafer W on which the liquid film L of the IPA liquid is formed on the holding plate 32 by the lifter 39 (see FIG. 10A, etc.) and irradiates the monochromatic beams to the wafer W using the monochromatic beam irradiating part 75. The drying process unit 17C picks up the image of the wafer W using the imaging device 72.

In some embodiments, the drying process unit 17C may pick up the image of the wafer W by radiating the monochromatic beams to the wafer W supported by the lifter 39.

When the monochromatic beams are irradiated to the wafer W on which the liquid film L of the IPA liquid is formed in a downwardly inclined direction, an interference pattern is generated by interference between reflected beams generated when the monochromatic beams are reflected at a front surface of the liquid film L of the IPA liquid, and reflected beams generated when the monochromatic beams are reflected at the wafer W and then emitted from the liquid film L of the IPA liquid. The imaging device 72 picks up the interference pattern generated due to the liquid film L of the IPA liquid.

Figure 20:
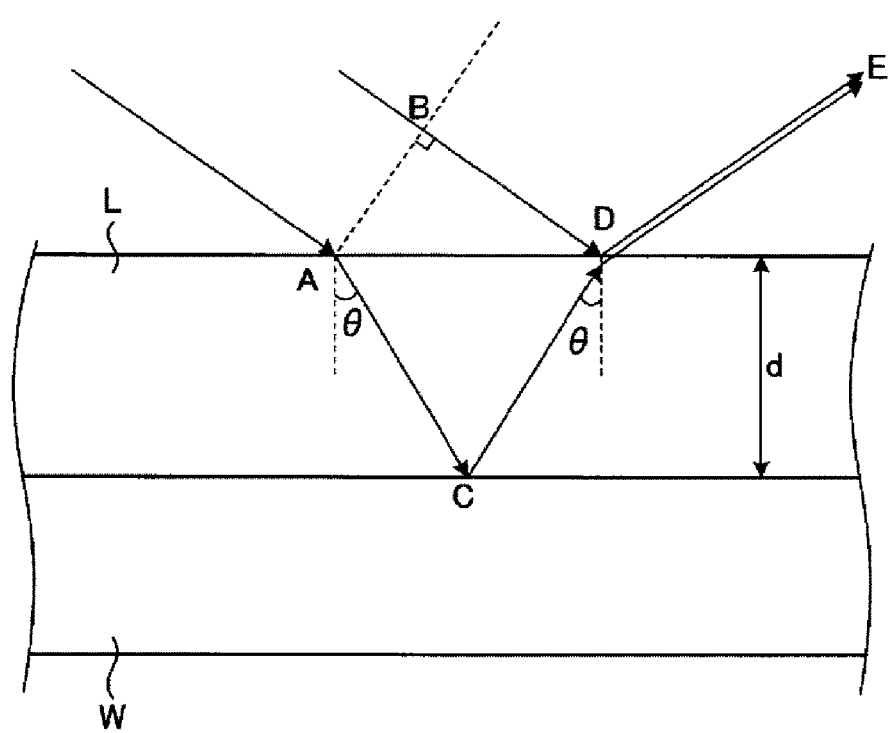
FIG. 20 is a view illustrating the generation principle of an interference pattern.

For example, in a case where the imaging device 72 is disposed in the vicinity of a point E shown in FIG. 20, an interference pattern according to a path difference (ACD-BD) is generated. FIG. 20 is a view illustrating the generation principle of the interference pattern.

Assuming that a film thickness of the liquid film L is d, a refractive index of the liquid film L is n, a refractive index of the air is 1.0, and an incident angle is θ, an optical path difference according to the path difference is defined as 2nd cos θ.

When the optical path difference satisfies the condition of the following Equation 1, bright lines are generated by interference between the reflected beams reflected at the front surface of the liquid film L of the IPA liquid and the reflected beams reflected at the wafer W and then emitted from the liquid film L of the IPA liquid.

$$2nd \cos \theta = (m+\tfrac{1}{2})\lambda \quad (1)$$

where, λ is the wavelength of a monochromatic beam, and m is an integer.

On the other hand, when the optical path difference satisfies the condition of the following Equation 2, dark lines are generated by interference between the reflected beams reflected at the front surface of the liquid film L of the IPA liquid and the reflected beams reflected at the wafer W and then emitted from the liquid film L of the IPA liquid.

$$2nd \cos \theta = m\lambda \quad (2)$$

As described above, the dark lines are generated at a portion where the optical path difference is an integer multiple of the wavelength λ of the monochromatic beam, and the bright lines are generated at a portion where the optical path difference is deviated by a half wavelength from the wavelength λ of the monochromatic beam. This causes the interference pattern. Further, the interference pattern is dependent upon the film thickness d of the IPA liquid formed on the wafer W.

Figure 21A:
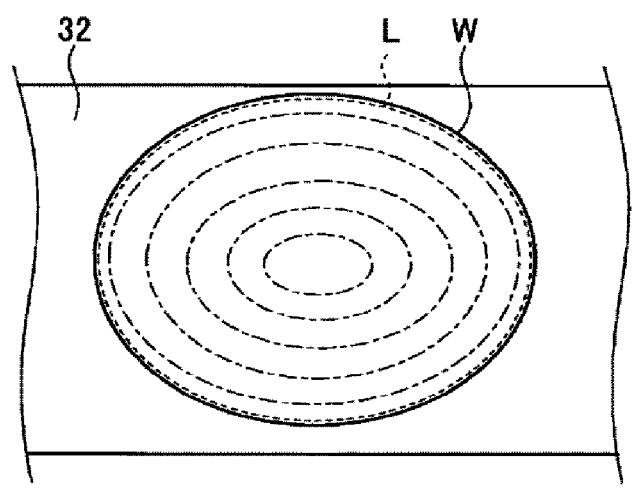
FIG. 21A is a schematic view of a wafer in which no defective portion is generated in a liquid film formed of an IPA liquid when obliquely viewed from the top.

For these reasons, in the case where no defective portion Wa is generated in the liquid film L of the IPA liquid, when the monochromatic beams are irradiated to the IPA liquid formed on the circular wafer W, a substantially elliptical interference pattern is generated as indicated by a dashed-dotted line in FIG. 21A. FIG. 21A is a schematic view of the wafer W in which no defective portion Wa is generated in the liquid film L of the IPA liquid, as obliquely viewed from the top.

Figure 21B:
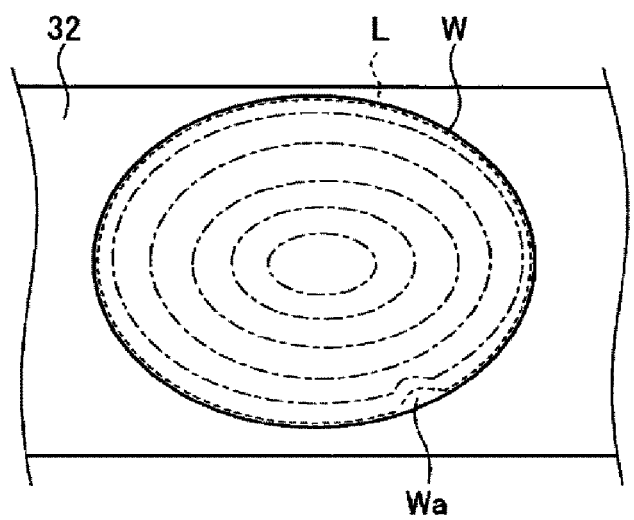
FIG. 21B is a schematic view of a wafer in which no defective portion is generated in a liquid film formed of an IPA liquid when obliquely viewed from the top.

On the other hand, in the case where the defective portion Wa is generated in the liquid film L of the IPA liquid, when the monochromatic beams are irradiated to the IPA liquid formed on the circular wafer W, an interference pattern having a portion formed to be partially concave toward the central side of the wafer W according to the defective portion Wa is generated, as indicated by a dashed-dotted line in FIG. 21B. FIG. 21B is a schematic view of the wafer W in which the defective portion Wa is generated in the liquid film L of the IPA liquid, as obliquely viewed from the top.

As described above, it is possible to detect the presence of absence of the defective portion Wa by irradiating the monochromatic beams to the wafer W on which the liquid film L of the IPA liquid is formed and picking up the interference pattern thus generated.

<Configuration of Control Device>

The configuration of the control device 4 according to the fourth embodiment will be described with reference to the block diagram of FIG. 17, with a focus on the differences from the control device 4 according to the third embodiment, and the description of the same configuration as the control device 4 according to the third embodiment will be omitted.

Image data obtained by picking up the wafer W using the imaging device 72 is inputted to the control part 19 of the control device 4.

The coating state detecting part 19B detects a coating state of the wafer W on the basis of the image data of the wafer W obtained by the imaging device 72. Specifically, the coating state detecting part 19B compares an image data obtained by picking up the wafer W in which no defective portion Wa is generated in the liquid film L of the IPA liquid, and an image data obtained by picking up the wafer W in the current process, and detects the coating state of the wafer W based on the comparison result. Further, the image data obtained by picking up the wafer W in which no defective portion Wa is generated in the liquid film L of the IPA liquid, is stored in advance in the memory part 20.

The substrate processing system according to the fourth embodiment irradiates the monochromatic beams to the wafer W on which the liquid film L of the IPA liquid is formed, using the monochromatic beam irradiating part 75 such as a sodium lamp, and picks up the wafer W using the imaging device 72. Further, the substrate processing system detects the coating state of the wafer W on the basis of the obtained image data of the wafer W.

Accordingly, when the defective portion Wa is generated in the liquid film L of the IPA liquid, the substrate processing system according to the fourth embodiment can accurately detect the generation of the defective portion Wa. Further, the substrate processing system according to the fourth embodiment can prevent the drying process from being performed in the state where the defective portion Wa is generated in the liquid film L of the IPA liquid. Therefore, the substrate processing system according to the fourth embodiment can suppress the occurrence of pattern collapse.

Modified Example

When a liquid amount of the liquid film L is too small, when the defective portion Wa generated in the liquid film L of the IPA liquid is large, or when many defective portions Wa are generated in the liquid film L of the IPA liquid, a substrate processing system according to a modified example may determine that pattern collapse has occurred in the wafer W and may handle the wafer W as a defective wafer. For example, the substrate processing system according to the modified example determines whether pattern collapse has occurred by comparing the liquid amount of the liquid film L and the generation level of the defective portion Wa with predetermined respective threshold values. Accordingly, it is possible to prevent the regulation of the liquid amount of the IPA liquid in the wafer W having pattern collapse, thus efficiently performing the substrate process.

For example, when the liquid amount of the liquid film L is larger than an upper limit value in a first predetermined range, the substrate processing system according to the modified example may increase the exhaust amount of the supercritical fluid in the drying process unit 17. Accordingly, the substrate processing system according to the modified example can suppress the generation of particles without regulating the liquid amount of the IPA liquid.

In the substrate processing system according to the modified example, the load cell, the infrared sensor and the like may be installed in the cleaning process unit 16 and the drying process unit 17. With this configuration, the substrate processing system according to the modified example can transfer the wafer W from the cleaning process unit 16 in a state where the liquid amount of the liquid film L and the coating state are normal. Accordingly, after the wafer W is transferred to the drying process unit 17, if the liquid amount of the liquid film L or the coating state is abnormal, it may be possible to determine that a problem occurs in the course of transferring the wafer W from the cleaning process unit 16 to the drying process unit 17. That is to say, it is possible to easily specify a cause of the occurrence of the problem.

In the substrate processing system according to the modified example, the load cell may be installed in the substrate transfer device 18. This reduces the number of load cells used in the substrate processing system. Further, in the substrate processing system according to the modified example, the infrared sensor 27, the imaging device 72 and the like may be installed in the cleaning process unit 16, and the load cell 39c may be installed in the drying process unit 17.

The substrate processing system according to the modified example may compare a weight of the wafer W on which the liquid film L of the IPA liquid is formed with a first preset weight and determine whether a liquid amount of the liquid film L is normal. Further, the substrate processing system according to the modified example may compare a weight of the wafer W after the drying process with a second preset weight and determine whether a dried state is normal. With this configuration, it is possible to determine whether the liquid amount of the liquid film L or the dried state is normal without installing the load cell 43 in the delivering part 14. This reduces the number of load cells used in the substrate processing system.

The substrate processing system according to the modified example may measure a temperature of the wafer W using the infrared sensor 60, for example, in a state where the wafer W is received in the main body 31 of the drying process unit 17A according to the second embodiment. With this configuration, even in a case where hardly a temperature of the entire area of the wafer W mounted on the holding plate 32 is measured, it is possible to measure the temperature of the entire area of the wafer W using a single infrared sensor 60.

Figure 22:
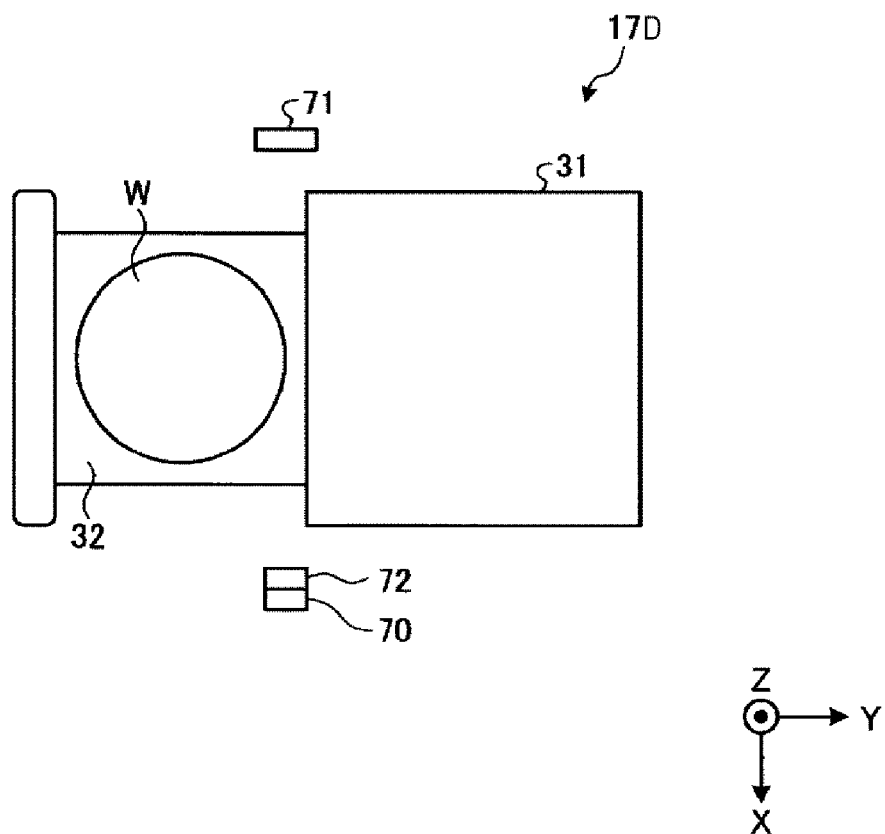
FIG. 22 is a schematic plan view of a drying process unit of a substrate processing system according to a modified example.

Further, the substrate processing system according to the modified example, for example, may irradiate laser beams toward the wafer W using the laser irradiation part 70 in a state where the wafer W is received in the main body 31 of the drying process unit 17B according to the third embodiment. In this case, as shown in FIG. 22, the laser irradiation part 70 may be disposed anywhere as long as it can irradiate a single laser beam to an edge of the wafer W close to the main body 31. FIG. 22 is a schematic plan view of the drying process unit 17D of the substrate processing system according to the modified example.

Further, the substrate processing system according to the modified example may continuously pick up the reflected beams projected onto the screen 71 using the imaging device 72 in a state where the wafer W is received in the main body 31. The substrate processing system according to the modified example can obtain the entire image data of the reflected beams throughout the wafer W by combining image data obtained in the above manner. With this configuration, it is possible to detect the coating state of the wafer W using the laser irradiation part 70 that irradiates a single laser beam.

Further, the substrate processing system according to the modified example may pick up the reflected beams projected onto the screen 71 using the imaging device 72, before mounting, on the holding plate 32, the wafer W on which the liquid film L of the IPA liquid is formed, for example, in the state where the wafer W is mounted on the lifter 39A (see FIG. 10A, etc.).

Further, the substrate processing system according to the modified example may detect a coating state in accordance with a change in an interference pattern in the drying process unit 17C of the fourth embodiment. The IPA liquid formed on the wafer W evaporates over time. Thus, a film thickness d of the liquid film L of the IPA liquid becomes thinner over time. That is to say, a position where an interference pattern as a function of the film thickness d of the liquid film L of the IPA liquid is changed over time. However, since no IPA liquid exists and no interference pattern is generated, there is no change of the defective portion Wa in the image even with time.

As described above, the substrate processing system according to the modified example may detect a coating state on the basis of the change in the interference pattern. Accordingly, the substrate processing system according to the modified example can detect the coating state of the wafer W.

In some embodiments, the substrate processing system according to the modified example may pick up the wafer W on which the liquid film L of the IPA liquid is formed, using the imaging device 72, and detect a coating state of the wafer W on the basis of image data obtained by the picking up. Further, the substrate processing system according to the modified example may pick up the wafer W after the drying process using an imaging device such as a camera, and detect a surface state of the wafer W after the drying process on the basis of image data thus obtained. Accordingly, the substrate processing system according to the modified example can more accurately determine the surface state of the wafer W after the drying process, specifically whether the wafer W has been sufficiently dried.

Further, the substrate processing system according to the modified example may pick up the wafer W on which the liquid film L of the IPA liquid is formed, using a camera, and estimate a liquid amount of the liquid film L formed on the wafer W on the basis of image data thus obtained.

In the substrate processing system according to the modified example, when the dried state of the wafer W is abnormal, the wafer W of which the dried state is abnormal may be discarded as a defective wafer. Further, when the dried state of the wafer W is abnormal, for example, when the wafer W has not been sufficiently dried, the substrate processing system according to the modified example may perform the drying process again.

Further, the method of detecting the liquid amount, the method of detecting the coating state, and the method of detecting the dried state of the wafer W are not limited to be applied to the substrate processing system including the drying process unit that uses the supercritical fluid. As an example, such methods may be applied to various substrate processing systems that form a liquid film of a liquid on a wafer W and then dry the wafer.

Further, the substrate processing systems according to the above embodiments and the substrate processing system according to the modified example may be appropriately combined with each other in configuration.

According to the present disclosure in some embodiments, it is possible to improve the yield of a substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus comprising:
   a liquid amount detector configured to detect a liquid amount of a liquid film formed on a substrate;
   a dryer configured to perform a drying process on the substrate on which the liquid film is formed; and
   a load cell configured to measure a weight of the substrate,
   wherein the dryer includes:
      a main body having an opening, through which the substrate is loaded and unloaded with respect to the main body and which is formed in a side surface of the main body; and
      a lifter provided outside the main body, and configured to receive the substrate on which the liquid film is formed from a robot arm and deliver the substrate after the drying process is finished to the robot arm,
   wherein the lifter includes lifter pins configured to support the substrate, and a supporter configured to support the lifter pins on an upper surface of the supporter, and wherein the load cell is installed on a lower surface of the supporter.

2. The substrate processing apparatus of claim 1, wherein the liquid amount detector is further configured to detect the liquid amount of the liquid film formed on the substrate based on the weight of the substrate measured by the load cell.

3. The substrate processing apparatus of claim 1, wherein the liquid amount detector is further configured to detect the liquid amount before the substrate is transferred to the dryer.

4. The substrate processing apparatus of claim 1, wherein the liquid amount detector is further configured to detect the liquid amount of the liquid film formed on the substrate by measuring the weight of the substrate by the load cell before the substrate on which the liquid film is formed is loaded into the main body of the dryer, and calculating a difference between the measured weight and a first preset weight.

5. The substrate processing apparatus of claim 1, wherein the liquid amount detector is further configured to detect a dried state of the substrate by measuring the weight of the substrate unloaded from the main body of the dryer by the load cell, and calculating a difference between the measured weight and a preset weight.

6. The substrate processing apparatus of claim 1, wherein the load cell is further configured to measure a first weight of the substrate before the substrate on which the liquid film is formed is loaded into the main body of the dryer, and a second weight of the substrate unloaded from the main body of the dryer after the drying process is finished, and
   wherein the liquid amount detector is further configured to detect the liquid amount of the liquid film formed on the substrate or a dried state of the substrate based on the first weight and the second weight.

7. A substrate processing method using the substrate processing apparatus of claim 1, comprising:
   detecting a first weight of a substrate having a surface on which a liquid film is formed before a drying process;
   performing the drying process on the substrate on which the liquid film has been formed;
   detecting a second weight of the substrate after the drying process; and
   detecting a state of the surface of the substrate after the drying process.

8. A substrate processing method using the substrate processing apparatus of claim 1, comprising:
   detecting a first weight of a substrate having a surface on which a liquid film is formed before a drying process;
   performing the drying process on the substrate on which the liquid film has been formed; and
   detecting a second weight of the substrate after the drying process.

* * * * *